(12) United States Patent
Kim et al.

(10) Patent No.: US 9,202,715 B2
(45) Date of Patent: Dec. 1, 2015

(54) INTEGRATED CIRCUIT PACKAGING SYSTEM WITH CONNECTION STRUCTURE AND METHOD OF MANUFACTURE THEREOF

(75) Inventors: YoungChul Kim, Youngin-si (KR); KyungHoon Lee, Icheon (KR); Seong Won Park, Icheon-si (KR); Ki Youn Jang, Ichon-si (KR); JaeHyun Lee, Sungnam (KR); DeokKyung Yang, Hanam-si (KR); In Sang Yoon, Ichon-si (KR); SungEun Park, Seoul (KR)

(73) Assignee: STATS ChipPAC Ltd., Singapore (SG)

( * ) Notice: Subject to any disclaimer, the term of this patent is extended or adjusted under 35 U.S.C. 154(b) by 0 days.

(21) Appl. No.: 13/298,267

(22) Filed: Nov. 16, 2011

(65) Prior Publication Data

US 2012/0119360 A1 May 17, 2012

Related U.S. Application Data

(60) Provisional application No. 61/414,419, filed on Nov. 16, 2010.

(51) Int. Cl.
*H01L 23/31* (2006.01)
*H01L 21/56* (2006.01)
*H01L 23/498* (2006.01)
(Continued)

(52) U.S. Cl.
CPC .......... *H01L 21/565* (2013.01); *H01L 23/3128* (2013.01); *H01L 23/49811* (2013.01); *H01L 23/49816* (2013.01); *H01L 23/49822* (2013.01); *H01L 24/16* (2013.01); *H01L 24/48* (2013.01); *H01L 25/105* (2013.01); *H01L 2224/16225* (2013.01); *H01L 2224/32225* (2013.01); *H01L 2224/48227* (2013.01); *H01L 2224/73204* (2013.01); *H01L 2224/83102* (2013.01); *H01L 2224/92125* (2013.01); *H01L 2225/1023* (2013.01); *H01L 2225/1058* (2013.01); *H01L 2924/01079* (2013.01); *H01L 2924/1533* (2013.01); *H01L 2924/15311* (2013.01); *H01L 2924/15331* (2013.01); *H01L 2924/1815* (2013.01); *H01L 2924/18161* (2013.01); *H01L 2924/18165* (2013.01); *H01L 2924/3511* (2013.01)

(58) Field of Classification Search
CPC ................ H01L 24/01; H01L 23/3128; H01L 23/49811; H01L 23/49816; H01L 23/49822; H01L 24/16; H01L 25/105; H01L 2224/16225; H01L 2224/48227; H01L 21/565; H01L 21/566; H01L 23/3114
USPC ........... 438/107, 119, 127, 15, 25–26, 51, 64, 438/106, 55; 257/686, 737, 787, E23.068, 257/E23.116, E23.001, E21.499, E21.502, 257/733, 779, 780, E23.015, 678
See application file for complete search history.

(56) References Cited

U.S. PATENT DOCUMENTS 5,450,283 A * 9/1995 Lin et al. ........................ 361/704
6,271,469 B1 * 8/2001 Ma et al. ........................ 174/521

(Continued)

*Primary Examiner* — Jarrett Stark
*Assistant Examiner* — Bitew Dinke
(74) *Attorney, Agent, or Firm* — Ishimaru & Associates LLP

(57) ABSTRACT

A method of manufacture of an integrated circuit packaging system includes: providing a substrate; attaching a connection post to the substrate, the connection post having a post top and a post side; mounting an integrated circuit die on the substrate, the integrated circuit die having a top die surface; and forming a package body on the substrate, the connection post, and the integrated circuit die.

10 Claims, 9 Drawing Sheets

(51) Int. Cl.
*H01L 23/00* (2006.01)
*H01L 25/10* (2006.01)

(56) References Cited

U.S. PATENT DOCUMENTS

| | | | |
|---|---|---|---|
| 6,489,676 B2 | 12/2002 | Taniguchi et al. | |
| 7,034,386 B2 | 4/2006 | Kurita | |
| 7,208,834 B2 | 4/2007 | Lee et al. | |
| 7,242,081 B1 | 7/2007 | Lee | |
| 7,345,361 B2 | 3/2008 | Mallik et al. | |
| 7,633,765 B1* | 12/2009 | Scanlan et al. | 361/760 |
| 7,671,459 B2 | 3/2010 | Corisis et al. | |
| 7,791,206 B2* | 9/2010 | Takeuchi et al. | 257/774 |
| 7,808,095 B2 | 10/2010 | Jung | |
| 7,923,304 B2 | 4/2011 | Choi et al. | |
| 7,927,917 B2 | 4/2011 | Pagaila et al. | |
| 7,951,643 B2 | 5/2011 | Ha et al. | |
| 8,035,235 B2* | 10/2011 | Jang et al. | 257/787 |
| 8,278,746 B2* | 10/2012 | Ding et al. | 257/686 |
| 8,435,881 B2* | 5/2013 | Choi et al. | 438/612 |
| 8,546,194 B2* | 10/2013 | Choi et al. | 438/127 |
| 2002/0060361 A1* | 5/2002 | Sasaki | 257/698 |
| 2002/0135057 A1* | 9/2002 | Kurita | 257/685 |
| 2003/0137038 A1* | 7/2003 | Lin et al. | 257/678 |
| 2005/0184377 A1* | 8/2005 | Takeuchi et al. | 257/686 |
| 2007/0164457 A1 | 7/2007 | Yamaguchi et al. | |
| 2007/0194423 A1* | 8/2007 | Yim et al. | 257/686 |
| 2008/0023805 A1 | 1/2008 | Howard et al. | |
| 2008/0169550 A1* | 7/2008 | Kurita | 257/686 |
| 2008/0230887 A1 | 9/2008 | Sun et al. | |
| 2009/0035893 A1* | 2/2009 | Nishiyama et al. | 438/121 |
| 2009/0102030 A1* | 4/2009 | Khan et al. | 257/675 |
| 2009/0174064 A1* | 7/2009 | Lee et al. | 257/712 |
| 2009/0243065 A1* | 10/2009 | Sugino et al. | 257/686 |
| 2009/0250810 A1* | 10/2009 | Pendse | 257/723 |
| 2009/0315192 A1* | 12/2009 | Usami | 257/787 |
| 2010/0000775 A1* | 1/2010 | Shen et al. | 174/260 |
| 2010/0019360 A1* | 1/2010 | Khan et al. | 257/675 |
| 2010/0148337 A1* | 6/2010 | Liu et al. | 257/686 |
| 2010/0155992 A1* | 6/2010 | Kurashima et al. | 264/272.14 |
| 2010/0171205 A1* | 7/2010 | Chen et al. | 257/686 |
| 2010/0224974 A1* | 9/2010 | Shim et al. | 257/685 |
| 2010/0230810 A1* | 9/2010 | Kang et al. | 257/737 |
| 2010/0244219 A1* | 9/2010 | Pagaila et al. | 257/686 |
| 2010/0276792 A1* | 11/2010 | Chi et al. | 257/660 |
| 2011/0024887 A1* | 2/2011 | Chi et al. | 257/684 |
| 2011/0057308 A1* | 3/2011 | Choi et al. | 257/737 |
| 2011/0062574 A1* | 3/2011 | Jang et al. | 257/686 |
| 2011/0117700 A1* | 5/2011 | Weng et al. | 438/109 |
| 2011/0241186 A1* | 10/2011 | Nalla et al. | 257/659 |
| 2011/0312133 A1* | 12/2011 | Park et al. | 438/122 |
| 2013/0049194 A1* | 2/2013 | Liu et al. | 257/737 |
| 2013/0059417 A1* | 3/2013 | Kikuchi et al. | 438/109 |

* cited by examiner

INTEGRATED CIRCUIT PACKAGING SYSTEM WITH CONNECTION STRUCTURE AND METHOD OF MANUFACTURE THEREOF

CROSS-REFERENCE TO RELATED APPLICATION(S)

This application claims the benefit of U.S. Provisional Patent Application Ser. No. 61/414,419 filed Nov. 16, 2010, and the subject matter thereof is incorporated herein by reference thereto.

TECHNICAL FIELD

The present invention relates generally to an integrated circuit packaging system, and more particularly to a system with a connection structure.

BACKGROUND ART

Electronic products have become an integral part of our daily lives. This has created a consistent if not increasing expectation for new features, higher speed, more data, improved portability, etc. These demands have driven the development of electronic technology to reduce size, improve utility, and increase performance of the integrated circuit devices in an ever-increasing range of products such as cell phones, music players, televisions, and automobiles.

Packages of components such as semiconductor circuits, transistors, diodes, and other electronic devices must also become smaller and thinner with more functions and connections. In packaging components, the need for stacking more components together in a reliable manner influences manufacturing processes.

Thus, a need still remains for a more reliable connection when stacking packages. In view of the increasing prices of raw materials and shrinking sizes of connections, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a substrate; attaching a connection post to the substrate, the connection post having a post top and a post side; mounting an integrated circuit die on the substrate, the integrated circuit die having a top die surface; and forming a package body on the substrate, the connection post, and the integrated circuit die.

The present invention provides an integrated circuit packaging system, including: a substrate; a connection post on the substrate, the connection post having a post top and a post side; an integrated circuit die on the substrate, the integrated circuit die having a top die surface; and a package body on the substrate, the connection post, and the integrated circuit die.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
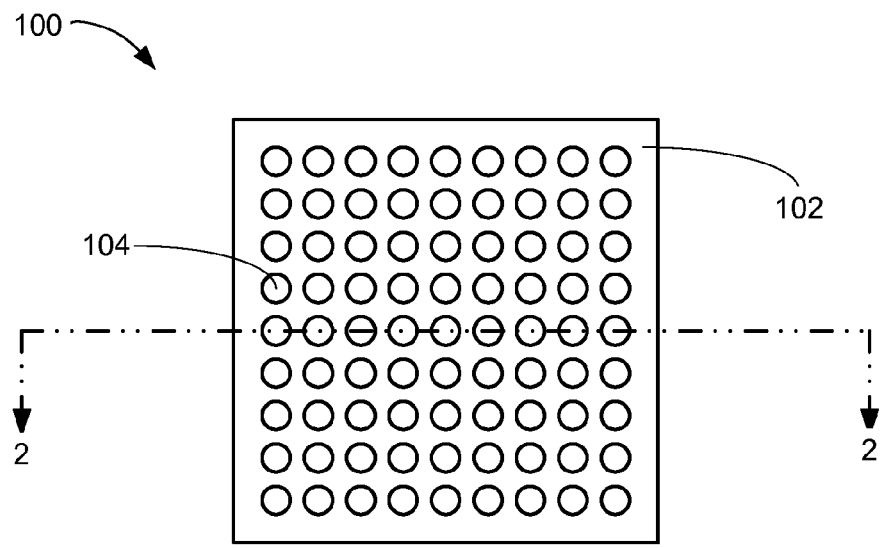
FIG. 1 is a bottom view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the non-active side of the integrated circuit die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements. The term "integrated circuit die" is defined as a semiconductor substrate having active circuitry on one side.

The term "processing" as used herein includes deposition of material or photoresist, patterning, exposure, development, etching, cleaning, and/or removal of the material or photoresist as required in forming a described structure.

Referring now to FIG. 1, therein is shown a bottom view of an integrated circuit packaging system 100 in a first embodiment of the present invention. The integrated circuit packaging system 100 is shown having a substrate 102 and an external interconnect 104. The substrate 102 is defined as a structure containing conductive traces and contacts. For example, the substrate 102 can be a laminate substrate, a ceramic substrate, or some other laminated structure for redistribution of signals. The external interconnect 104 can be attached to the system side of the substrate 102.

The external interconnect 104 is defined as an interface connector. For example, the external interconnect 104 can be a solder ball, a solder bump, a stud bump, a conductive pillar, or other conductive structure.

Figure 2:
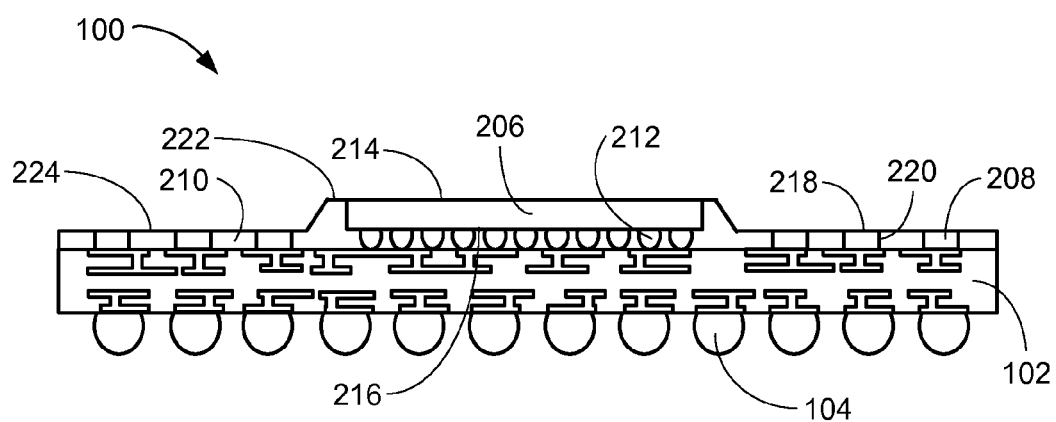
FIG. 2 is a cross-sectional view of the integrated circuit packaging system along the section line 2-2 of FIG. 1.

Referring now to FIG. 2, therein is shown a cross-sectional view of the integrated circuit packaging system 100 along the section line 2-2 of FIG. 1. The integrated circuit packaging system 100 is shown having an integrated circuit die 206, a connection post 208, a package body 210, the substrate 102, and the external interconnect 104, as an example.

The integrated circuit die 206 can be mounted on the substrate 102 and connected to the substrate 102 through an internal interconnect 212. For example, the integrated circuit die 206 can be a flip chip, a wire-bond chip, or other type of chip. The integrated circuit die 206 can include a top die surface 214. The top die surface 214 is defined as the non-active surface of the integrated circuit die 206. The integrated circuit die 206 can have an active side 216 opposite the top die surface 214. The active side 216 is defined as the side of the integrated circuit die 206 having active circuitry fabricated thereon.

The internal interconnect 212 is defined as an electrical connector. For example, the internal interconnect 212 can be a solder ball, a solder bump, or a conductive column.

The internal interconnect 212 can be on and between the integrated circuit die 206 and the substrate 102. In this example, the internal interconnect 212 can also support the integrated circuit die 206 over the substrate 102.

The connection post 208 can be attached to the substrate 102 around the integrated circuit die 206. The connection post 208 is defined as a solid connection structure that also performs a support function. For example, the connection post 208 can be a post, a pillar, a cylinder, or other pre-formed conductive support structure. Also for example, the connection post 208 can be covered in a protective coating (not shown) to prevent oxidation or corrosion of the connection post 208. The protective coating can be a material that does not easily oxidize such as a layer of nickel under a layer of gold, for example.

The connection post 208 can have a post top 218 and a post side 220. The post top 218 is defined as the surface of the connection post 208 opposite the substrate 102. For example, the post top 218 can be a flat surface. The post side 220 is defined as the non-horizontal surface of the connection post 208. For example, the post side 220 can extend from the top of the substrate 102 to the post top 218. The protective coating can be on the post top 218 of the connection post 208.

There can be multiple instances of the connection post 208 on the substrate 102. The plurality of the connection post 208 can be in an array and regularly spaced from each other. The connection post 208 can be adjacent to and around the integrated circuit die 206. The post top 218 of the connection post 208 can be lower than the top die surface 214 of the integrated circuit die 206. The post top 218 of the instances of the connection post 208 can be coplanar with each other. The instances of the connection post 208 can be separated by the package body 210.

The package body 210 is defined as a cover that provides a hermetic seal protecting components from the outside environment. For example, the package body 210 can be a film assisted molding, epoxy molding, moldable underfill, encapsulation, or other protective molding, and can protect sensitive components from moisture, dust and other contamination. The package body 210 can be molded on the substrate 102, the integrated circuit die 206, and the connection post 208. The package body 210 can be directly between the into/rated circuit die 206 and the substrate 102.

The package body 210 can include an upper top package surface 222 and a lower top package surface 224. The integrated circuit die 206 can be exposed from the upper top package surface 222. The upper top package surface 222 can be coplanar with the top die surface 214. The lower top package surface 224 can be coplanar with the post top 218. The sides of the package body 210 can be planar and coplanar with the sides of the substrate 102.

In this example, the package body 210 can be molded with a stepped mold (not shown). The step mold can cause the package body 210 to have a two level shape, with a higher level centered around the integrated circuit die 206, and a lower level around the instances of the connection post 208. The transition between the two levels can be at an angle so that the package body 210 around the integrated circuit die 206 is wider at the bottom than the top. The two level shape can create the upper top package surface 222 and the lower top package surface 224.

It has been discovered that having a protective coating on the post top 218 of the connection post 208 can allow for a finer pitch between the instances of the post top 218. For example, because solder will only be attracted to the protective coating on the post top 218, the chance of a short from solder bridging is minimized.

It has also been discovered that the top die surface 214 being exposed from the package body 210 can enable the manufacture of packages with thinner profiles. For example, because the package body 210 does not extend above the top die surface 214, the vertical height of the integrated circuit packaging system 100 can be minimized.

It has been discovered that by attaching the connection post 208 prior to molding the package body 210 on the substrate 102, cost of manufacture can be decreased. For example, because the connection post 208 is attached before molding the package body 210, a process to remove some of the package body 210 such as laser ablation can be avoided, and the manufacturing process simplified.

It has also been discovered that by using moldable underfill for the package body 210, cost and complexity of manufacture can be decreased. For example, because moldable underfill is liquid enough to flow under the integrated circuit die 206 unlike some other kinds of encapsulation, an underfill step can be combined with an encapsulation step, saving time, removing complexity, and saving material cost.

It has also been discovered that by using the connection post 208 as an extension of contact pads on the substrate 102 rather than solder balls, greater reliability can be achieved. For example, an extra reflow step can be skipped since the connection post 208 is ready for connection without reflow.

Figure 3:
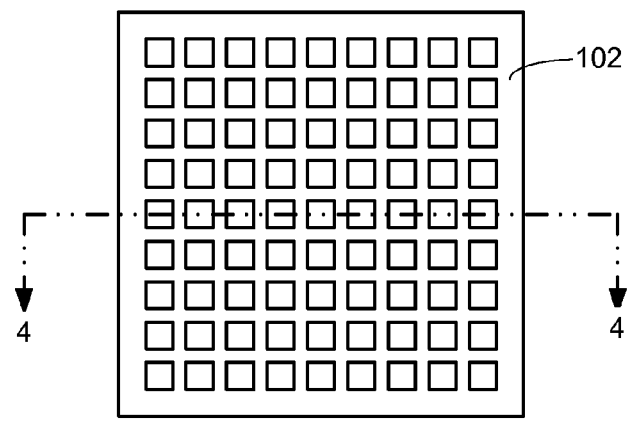
FIG. 3 is a bottom view of the substrate in a manufacturing step of the integrated circuit packaging system.

Referring now to FIG. 3, therein is shown a bottom view of the substrate 102 in a manufacturing step of the integrated circuit packaging system 100. The substrate 102 is shown with contacts for later attachment of the external interconnect 104 of FIG. 1.

For illustrative purposes, the substrate 102 is shown with the contacts in a regular, full matrix pattern, although it is understood that the substrate 102 can be different. For example, the substrate 102 can have the contacts in a non-fully populated matrix pattern, only along the perimeter of the substrate 102, or randomly distributed.

Figure 4:
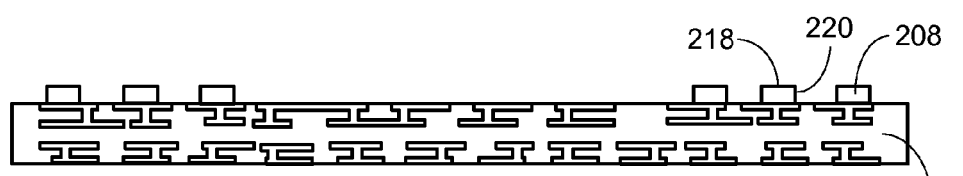
FIG. 4 is a cross-sectional view of the substrate along the section line 4-4 of FIG. 3.

Referring now to FIG. 4, therein is shown a cross-sectional view of the substrate 102 along the section line 4-4 of FIG. 3. The substrate 102 is shown with the connection post 208 attached to the substrate 102. The connection post 208 is shown in this manufacturing step with the post top 218 and the post side 220 exposed.

Figure 5:
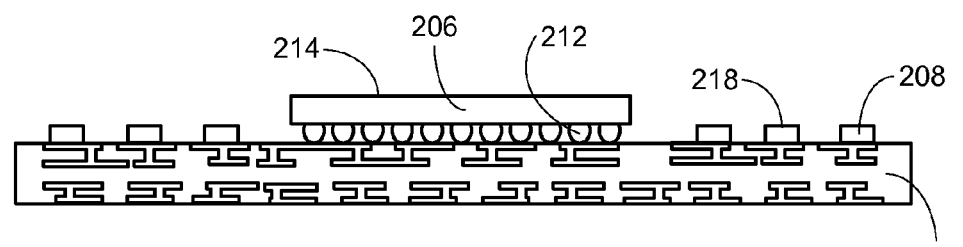
FIG. 5 is the structure of FIG. 4 in mounting the integrated circuit die on the substrate.

Referring now to FIG. 5, therein is shown the structure of FIG. 4 in mounting the integrated circuit die 206 on the substrate 102. The integrated circuit die 206 is shown attached to the substrate 102 with the internal interconnect 212. The integrated circuit die 206 can be mounted between instances of the connection post 208 in the center of the substrate 102. The top die surface 214 can be higher than the post top 218.

Figure 6:
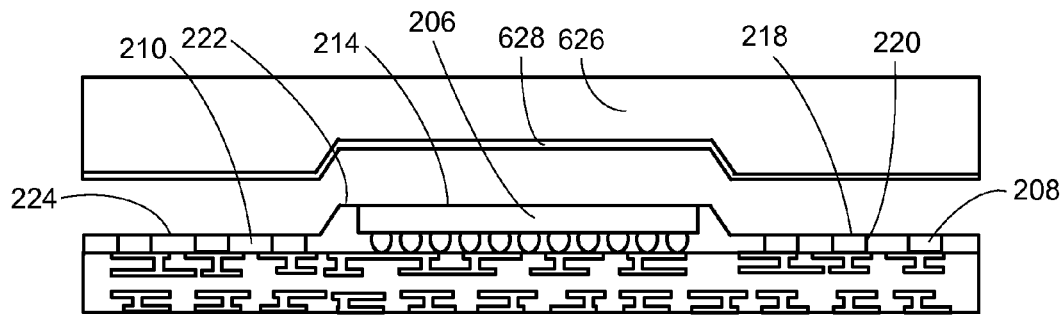
FIG. 6 is the structure of FIG. 5 in forming the package body.

Referring now to FIG. 6, therein is shown the structure of FIG. 5 in forming the package body 210. The package body 210 is shown molded on the integrated circuit die 206 and the connection post 208, the shape of the package body 210 formed by a mold chase 626 and an assist film 628. The mold chase 626 and the assist film 628 are shown after the package body 210 has been molded but before removal of the mold chase 626 and the assist film 628.

The assist film 628 is defined as a thin renewable film that conforms to underlying structures. For example, the assist film 628 can be a deformable seal film, an adhesive film, or other protective film on the mold chase 626. In this example, the mold chase 626 has a stepped shape in order to allow for forming the package body 210 with a two-level shape. The two-level shape can create the upper top package surface 222 and the lower top package surface 224.

The mold chase 626 and the assist film 628 can be used in different ways to control the shape of the package body 210. For example, the mold chase 626 and the assist film 628 can be positioned directly on the top die surface 214 and the post top 218 prior to molding the package body 210. The package body 210 can cover all other surfaces of the integrated circuit die 206 and the connection post 208 such as the post side 220. After removal of the mold chase 626 and the assist film 628, the top die surface 214 and the post top 218 can be exposed from the package body 210.

The upper top package surface 222 and the lower top package surface 224 can be characterized by the physical characteristics of the assist film 628. For example, the assist film 628 can cause the upper top package surface 222 to be smoother than with the use of the mold chase 626 alone due to the assist film 628 flattening out during the process of forming the package body 210. The assist film 628 being used can leave the post top 218 and the top die surface 214 with an unblemished surface due to the softness of the assist film 628. The assist film 628 can also leave the post top 218 and the top die surface 214 free of mold flash because the assist film 628 forms a seal against unnecessary bleeding of molding compound.

For illustrative purposes, the mold chase 626 is described as having a stepped shape, although it is understood that the mold chase 626 can have other shapes. For example, the mold chase 626 can be entirely planar, resulting in the package body 210 having a planar top surface. The mold chase 626 and the assist film 628 can define a planar surface so that the top surface of the package body 210, the top die surface 214, and the post top 218 can all be coplanar.

It has been discovered that the use of the assist film 628 during the formation of the package body 210 can help prevent damage to the integrated circuit die 206. For example, because the assist film 628 can absorb some of the pressure from the mold chase 626 as it is pressed down on the integrated circuit die 206, the incidence of cracks in the interlayer dielectric of the integrated circuit die 206 can be decreased, and reliability of the integrated circuit die 206 can be increased.

Figure 7:
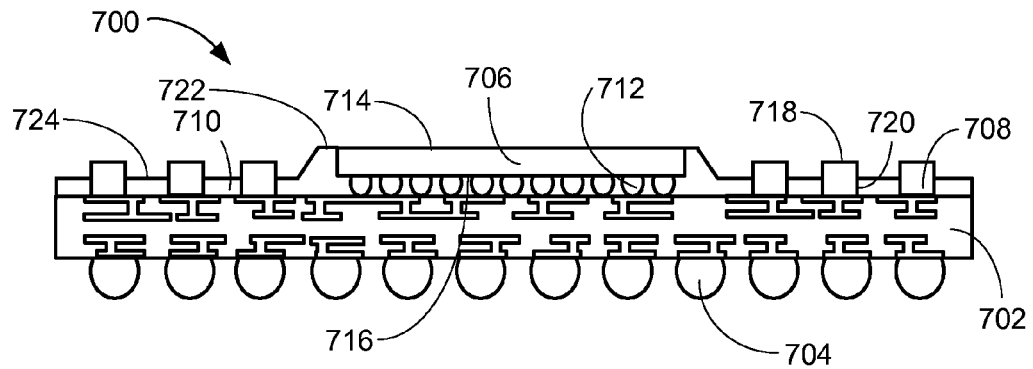
FIG. 7 is a cross-sectional view of the integrated circuit packaging system as exemplified by the bottom view of FIG. 1 and along the section line 2-2 of FIG. 1 in a second embodiment of the present invention.

Referring now to FIG. 7, therein is shown a cross-sectional view of the integrated circuit packaging system 700 as exemplified by the bottom view of FIG. 1 and along the section line 2-2 of FIG. 1 in a second embodiment of the present invention. The integrated circuit packaging system 700 is shown having a substrate 702, an external interconnect 704, an integrated circuit die 706, a connection post 708, and a package body 710, as an example.

The substrate 702 is defined as a structure containing conductive traces and contacts. For example, the substrate 702 can be a laminate substrate, a ceramic substrate, or some other laminated structure for redistribution of signals. The external interconnect 704 can be attached to the system side of the substrate 702.

The external interconnect 704 is defined as an interface connector. For example, the external interconnect 704 can be a solder ball, a solder bump, a stud bump, a conductive pillar, or other conductive structure.

The integrated circuit die 706 can be mounted on the substrate 702 and connected to the substrate 702 through an internal interconnect 712. For example, the integrated circuit die 706 can be a flip chip, a wire-bond chip, or other type of chip. The integrated circuit die 706 can include a top die surface 714. The top die surface 714 is defined as the non-active surface of the integrated circuit die 706. The integrated circuit die 706 can have an active side 716 opposite the top die surface 714. The active side 716 is defined as the side of the integrated circuit die 706 having active circuitry fabricated thereon.

The internal interconnect 712 is defined as an electrical connector. For example, the internal interconnect 712 can be a solder ball, a solder bump, or a conductive column.

The internal interconnect 712 can be on and between the integrated circuit die 706 and the substrate 702. In this example, the internal interconnect 712 can also support the integrated circuit die 706 over the substrate 702.

The connection post 708 can be attached to the substrate 702 around the integrated circuit die 706. The connection post 708 is defined as a solid connection structure that also performs a support function. For example, the connection post 708 can be a post, a pillar, a cylinder, or other pre-formed conductive support structure. Also for example, the connection post 708 can be covered in a protective coating (not shown) to prevent oxidation or corrosion of the connection post 708. The protective coating can be a material that does not easily oxidize such as a layer of nickel under a layer of gold, for example.

The connection post 708 can have a post top 718 and a post side 720. The post top 718 is defined as the surface of the connection post 708 opposite the substrate 702. For example, the post top 718 can be a flat surface. The post side 720 is defined as the non-horizontal surface of the connection post 708. For example, the post side 720 can extend from the top of the substrate 702 to the post top 718. The protective coating can be on the post top 718 of the connection post 708.

There can be multiple instances of the connection post 708 on the substrate 702. The plurality of the connection post 708 can be in an array and regularly spaced from each other. The connection post 708 can be adjacent to and around the integrated circuit die 706. The post top 718 of the connection post 708 can be lower than the top die surface 714 of the integrated circuit die 706. The post top 718 of the instances of the connection post 708 can be coplanar with each other. The instances of the connection post 708 can be separated by the package body 710.

The package body 710 is defined as a cover that provides a hermetic seal protecting components from the outside environment. For example, the package body 710 can be a film assisted molding, epoxy molding, moldable underfill, encapsulation, or other protective molding, and can protect sensitive components from moisture, dust and other contamination. The package body 710 can be molded on the substrate 702, the integrated circuit die 706, and the connection post 708.

The package body 710 can include an upper top package surface 722 and a lower top package surface 724. The integrated circuit die 706 can be exposed from the upper top package surface 722. The upper top package surface 722 can be coplanar with the top die surface 714. The lower top package surface 724 can be lower than the post top 718 so that the post top 718 and a portion of the post side 720 can be exposed above the lower top package surface 724. The sides of the package body 710 can be planar and coplanar with the sides of the substrate 702.

In this example, the package body 710 can be molded with a stepped mold (not shown). The step mold can cause the package body 710 to have a two level shape, with a higher level centered around the integrated circuit die 706, and a lower level around the instances of the connection post 708. The transition between the two levels can be at an angle so that the package body 710 around the integrated circuit die 706 is wider at the bottom than the top. The two level shape can create the upper top package surface 722 and the lower top package surface 724.

It has been discovered that having a protective coating on the post top 718 of the connection post 708 can allow for a finer pitch between the instances of the post top 718. For example, because solder will only be attracted to the protective coating on the post top 718, the chance of a short from solder bridging is minimized.

It has also been discovered that the top die surface 714 being exposed from the package body 710 can enable the manufacture of packages with thinner profiles. For example, because the package body 710 does not extend above the top die surface 714, the vertical height of the integrated circuit packaging system 700 can be minimized.

It has been discovered that by attaching the connection post 708 prior to molding the package body 710 on the substrate 702, cost of manufacture can be decreased. For example, because the connection post 708 is attached before molding the package body 710, a process to remove some of the package body 710 such as laser ablation can be avoided, and the manufacturing process simplified.

It has also been discovered that by using moldable underfill for the package body 710, cost and complexity of manufacture can be decreased. For example, because moldable underfill is liquid enough to flow under the integrated circuit die 706 unlike some other kinds of encapsulation, an underfill step can be combined with an encapsulation step, saving time, removing complexity, and saving material cost.

It has also been discovered that by using the connection post 708 as an extension of contact pads on the substrate 702 rather than solder balls, greater reliability can be achieved. For example, an extra reflow step can be skipped since the connection post 708 is ready for connection without reflow.

Figure 8:
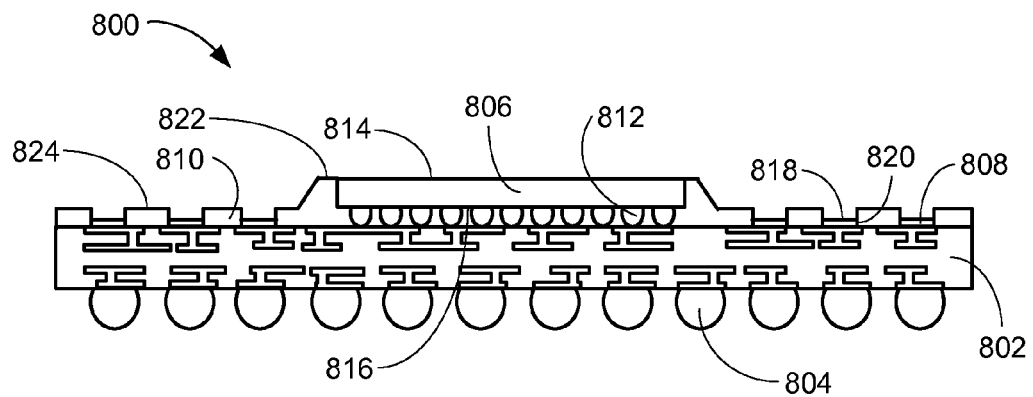
FIG. 8 is a cross-sectional view of the integrated circuit packaging system as exemplified by the bottom view of FIG. 1 and along the section line 2-2 of FIG. 1 in a third embodiment of the present invention.

Referring now to FIG. 8, therein is shown a cross-sectional view of the integrated circuit packaging system 800 as exemplified by the bottom view of FIG. 1 and along the section line 2-2 of FIG. 1 in a third embodiment of the present invention. The integrated circuit packaging system 800 is shown having a substrate 802, an external interconnect 804, an integrated circuit die 806, a connection post 808, and a package body 810, as an example.

The substrate 802 is defined as a structure containing conductive traces and contacts. For example, the substrate 802 can be a laminate substrate, a ceramic substrate, or some other laminated structure for redistribution of signals. The external interconnect 804 can be attached to the system side of the substrate 802.

The external interconnect 804 is defined as an interface connector. For example, the external interconnect 804 can be a solder ball, a solder bump, a stud bump, a conductive pillar, or other conductive structure.

The integrated circuit die 806 can be mounted on the substrate 802 and connected to the substrate 802 through an internal interconnect 812. For example, the integrated circuit die 806 can be a flip chip, a wire-bond chip, or other type of chip. The integrated circuit die 806 can include a top die surface 814. The top die surface 814 is defined as the non-active surface of the integrated circuit die 806. The integrated circuit die 806 can have an active side 816 opposite the top die surface 814. The active side 816 is defined as the side of the integrated circuit die 806 having active circuitry fabricated thereon.

The internal interconnect 812 is defined as an electrical connector. For example, the internal interconnect 812 can be a solder ball, a solder bump, or a conductive column.

The internal interconnect 812 can be on and between the integrated circuit die 806 and the substrate 802. In this example, the internal interconnect 812 can also support the integrated circuit die 806 over the substrate 802.

The connection post 808 can be attached to the substrate 802 around the integrated circuit die 806. The connection post 808 is defined as a solid connection structure that also performs a support function. For example, the connection post 808 can be a post, a pillar, a cylinder, or other pre-formed conductive support structure. Also for example, the connection post 808 can be covered in a protective coating (not shown) to prevent oxidation or corrosion of the connection post 808. The protective coating can be a material that does not easily oxidize such as a layer of nickel under a layer of gold, for example.

The connection post 808 can have a post top 818 and a post side 820. The post top 818 is defined as the surface of the connection post 808 opposite the substrate 802. For example, the post top 818 can be a flat surface. The post side 820 is defined as the non-horizontal surface of the connection post 808. For example, the post side 820 can extend from the top of the substrate 802 to the post top 818. The protective coating can be on the post top 818 of the connection post 808.

There can be multiple instances of the connection post 808 on the substrate 802. The plurality of the connection post 808 can be in an array and regularly spaced from each other. The connection post 808 can be adjacent to and around the integrated circuit die 806. The post top 818 of the connection post 808 can be lower than the top die surface 814 of the integrated circuit die 806. The post top 818 of the instances of the connection post 808 can be coplanar with each other. The instances of the connection post 808 can be separated by the package body 810.

The package body 810 is defined as a cover that provides a hermetic seal protecting components from the outside environment. For example, the package body 810 can be a film assisted molding, epoxy molding, moldable underfill, encapsulation, or other protective molding, and can protect sensitive components from moisture, dust and other contamination. The package body 810 can be molded on the substrate 802, the integrated circuit die 806, and the connection post 808.

The package body 810 can include an upper top package surface 822 and a lower top package surface 824. The integrated circuit die 806 can be exposed from the upper top package surface 822. The upper top package surface 822 can be coplanar with the top die surface 814. The lower top package surface 824 can be higher than the post top 818 so that the post top 818 can be recessed below the level of the lower top package surface 824. The sides of the package body 810 can be planar and coplanar with the sides of the substrate 802.

In this example, the package body 810 can be molded with a stepped mold (not shown). The step mold can cause the package body 810 to have a two level shape, with a higher level centered around the integrated circuit die 806, and a lower level around the instances of the connection post 808. The transition between the two levels can be at an angle so that the package body 810 around the integrated circuit die 806 is wider at the bottom than the top. The two level shape can create the upper top package surface 822 and the lower top package surface 824.

It has been discovered that having a protective coating on the post top 818 of the connection post 808 and the package body 810 between the instances of the connection post 808 can allow for a finer pitch between the instances of the post top 818. For example, because solder will only be attracted to the protective coating on the post top 818, and physically separated by the package body 810, the chance of a short from solder bridging is minimized.

It has also been discovered that the top die surface 814 being exposed from the package body 810 can enable the manufacture of packages with thinner profiles. For example, because the package body 810 does not extend above the top die surface 814, the vertical height of the integrated circuit packaging system 800 can be minimized.

It has been discovered that by attaching the connection post 808 prior to molding the package body 810 on the substrate 802, cost of manufacture can be decreased. For example, because the connection post 808 is attached before molding the package body 810, a process to remove some of the package body 810 such as laser ablation can be avoided, and the manufacturing process simplified.

It has also been discovered that by using moldable underfill for the package body 810, cost and complexity of manufacture can be decreased. For example, because moldable underfill is liquid enough to flow under the integrated circuit die 806 unlike some other kinds of encapsulation, an underfill step can be combined with an encapsulation step, saving time, removing complexity, and saving material cost.

It has also been discovered that by using the connection post 808 as an extension of contact pads on the substrate 802 rather than solder balls, greater reliability can be achieved. For example, an extra reflow step can be skipped since the connection post 808 is ready for connection without reflow.

Figure 9:
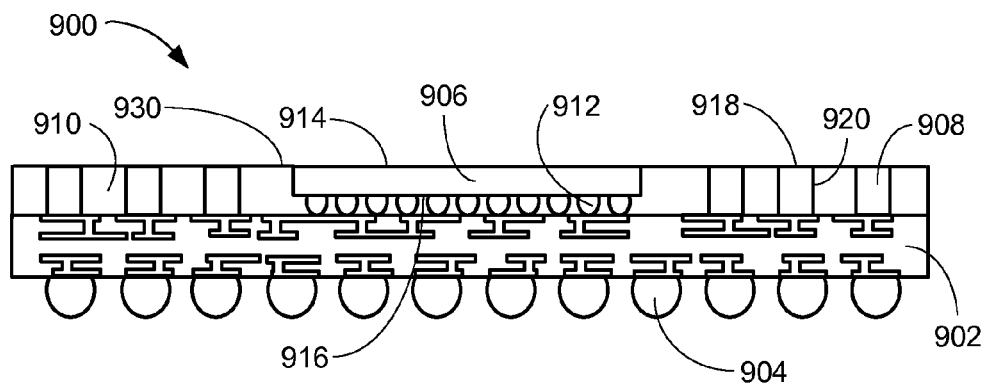
FIG. 9 is a cross-sectional view of the integrated circuit packaging system as exemplified by the bottom view of FIG. 1 and along the section line 2-2 of FIG. 1 in a fourth embodiment of the present invention.

Referring now to FIG. 9, therein is shown a cross-sectional view of the integrated circuit packaging system 900 as exemplified by the bottom view of FIG. 1 and along the section line 2-2 of FIG. 1 in a fourth embodiment of the present invention. The integrated circuit packaging system 900 is shown having a substrate 902, an external interconnect 904, an integrated circuit die 906, a connection post 908, and a package body 910, as an example.

The substrate 902 is defined as a structure containing conductive traces and contacts. For example, the substrate 902 can be a laminate substrate, a ceramic substrate, or some other laminated structure for redistribution of signals. The external interconnect 904 can be attached to the system side of the substrate 902.

The external interconnect 904 is defined as an interface connector. For example, the external interconnect 904 can be a solder ball, a solder bump, a stud bump, a conductive pillar, or other conductive structure.

The integrated circuit die 906 can be mounted on the substrate 902 and connected to the substrate 902 through an internal interconnect 912. For example, the integrated circuit die 906 can be a flip chip, a wire-bond chip, or other type of chip. The integrated circuit die 906 can include a top die surface 914. The top die surface 914 is defined as the non-active surface of the integrated circuit die 906. The integrated circuit die 906 can have an active side 916 opposite the top die surface 914. The active side 916 is defined as the side of the integrated circuit die 906 having active circuitry fabricated thereon.

The internal interconnect 912 is defined as an electrical connector. For example, the internal interconnect 912 can be a solder ball, a solder bump, or a conductive column.

The internal interconnect 912 can be on and between the integrated circuit die 906 and the substrate 902. In this example, the internal interconnect 912 can also support the integrated circuit die 906 over the substrate 902.

The connection post 908 can be attached to the substrate 902 around the integrated circuit die 906. The connection post 908 is defined as a solid connection structure that also performs a support function. For example, the connection post 908 can be a post, a pillar, a cylinder, or other pre-formed conductive support structure. Also for example, the connection post 908 can be covered in a protective coating (not shown) to prevent oxidation or corrosion of the connection post 908. The protective coating can be a material that does not easily oxidize such as a layer of nickel under a layer of gold, for example.

The connection post 908 can have a post top 918 and a post side 920. The post top 918 is defined as the surface of the connection post 908 opposite the substrate 902. For example, the post top 918 can be a flat surface. The post side 920 is defined as the non-horizontal surface of the connection post 908. For example, the post side 920 can extend from the top of the substrate 902 to the post top 918. The protective coating can be on the post top 918 of the connection post 908.

There can be multiple instances of the connection post 908 on the substrate 902. The plurality of the connection post 908 can be in an array and regularly spaced from each other. The connection post 908 can be adjacent to and around the integrated circuit die 906. The post top 918 of the connection post 908 can be the same height as the top die surface 914 of the integrated circuit die 906. The post top 918 of the instances of the connection post 908 can be coplanar with each other and with the top die surface 914. The instances of the connection post 908 can be separated by the package body 910.

The package body 910 is defined as a cover that provides a hermetic seal protecting components from the outside environment. For example, the package body 910 can be a film assisted molding, epoxy molding, moldable underfill, encapsulation, or other protective molding, and can protect sensitive components from moisture, dust and other contamination. The package body 910 can be molded on the substrate 902, the integrated circuit die 906, and the connection post 908.

The package body 910 can include a top package surface 930. The integrated circuit die 906 can be exposed from the top package surface 930. The top package surface 930 can be coplanar with the top die surface 914. Of the connection post 908, only the post top 918 can be exposed from the package body 910. The sides of the package body 910 can be planar and coplanar with the sides of the substrate 902.

In this example, the package body 910 can be molded with a planar mold chase (not shown). The planar mold chase can help form the package body 910 to have the top package surface 930 as a planar surface. The top package surface 930 can be coplanar with the top die surface 914 and the post top 918.

It has been discovered that having a protective coating on the post top 918 of the connection post 908 can allow for a finer pitch between the instances of the post top 918. For example, because solder will only be attracted to the protective coating on the post top 918, the chance of a short from solder bridging is minimized.

It has also been discovered that the top die surface 914 being exposed from the package body 910 can enable the manufacture of packages with thinner profiles. For example, because the package body 910 does not extend above the top die surface 914, the vertical height of the integrated circuit packaging system 900 can be minimized.

It has been discovered that by attaching the connection post 908 prior to molding the package body 910 on the substrate 902, cost of manufacture can be decreased. For example, because the connection post 908 is attached before molding the package body 910, a process to remove some of the package body 910 such as laser ablation can be avoided, and the manufacturing process simplified.

It has also been discovered that by using moldable underfill for the package body 910, cost and complexity of manufacture can be decreased. For example, because moldable underfill is liquid enough to flow under the integrated circuit die 906 unlike some other kinds of encapsulation, an underfill step can be combined with an encapsulation step, saving time, removing complexity, and saving material cost.

It has also been discovered that by using the connection post 908 as an extension of contact pads on the substrate 902 rather than solder balls, greater reliability can be achieved. For example, an extra reflow step can be skipped since the connection post 908 is ready for connection without reflow.

Figure 10:
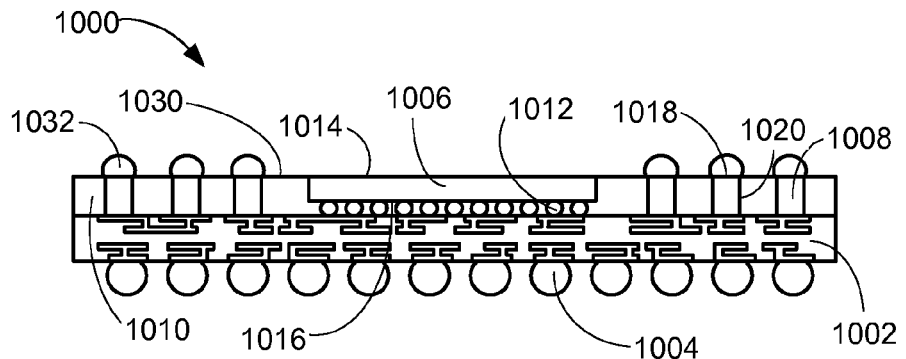
FIG. 10 is a cross-sectional view of the integrated circuit packaging system as exemplified by the bottom view of FIG. 1 and along the section line 2-2 of FIG. 1 in a fifth embodiment of the present invention.

Referring now to FIG. 10, therein is shown a cross-sectional view of the integrated circuit packaging system 1000 as exemplified by the bottom view of FIG. 1 and along the section line 2-2 of FIG. 1 in a fifth embodiment of the present invention. The integrated circuit packaging system 1000 is shown having a substrate 1002, an external interconnect 1004, an integrated circuit die 1006, a connection post 1008, and a package body 1010, as an example.

The substrate 1002 is defined as a structure containing conductive traces and contacts. For example, the substrate 1002 can be a laminate substrate, a ceramic substrate, or some other laminated structure for redistribution of signals. The external interconnect 1004 can be attached to the system side of the substrate 1002.

The external interconnect 1004 is defined as an interface connector. For example, the external interconnect 1004 can be a solder ball, a solder bump, a stud bump, a conductive pillar, or other conductive structure.

The integrated circuit die 1006 can be mounted on the substrate 1002 and connected to the substrate 1002 through an internal interconnect 1012. For example, the integrated circuit die 1006 can be a flip chip, a wire-bond chip, or other type of chip. The integrated circuit die 1006 can include a top die surface 1014. The top die surface 1014 is defined as the non-active surface of the integrated circuit die 1006. The integrated circuit die 1006 can have an active side 1016 opposite the top die surface 1014. The active side 1016 is defined as the side of the integrated circuit die 1006 having active circuitry fabricated thereon.

The internal interconnect 1012 is defined as an electrical connector. For example, the internal interconnect 1012 can be a solder ball, a solder bump, or a conductive column.

The internal interconnect 1012 can be on and between the integrated circuit die 1006 and the substrate 1002. In this example, the internal interconnect 1012 can also support the integrated circuit die 1006 over the substrate 1002.

The connection post 1008 can be attached to the substrate 1002 around the integrated circuit die 1006. The connection post 1008 is defined as a solid connection structure that also performs a support function. For example, the connection post 1008 can be a post, a pillar, a cylinder, or other pre-formed conductive support structure. Also for example, the connection post 1008 can be covered in a protective coating (not shown) to prevent oxidation or corrosion of the connection post 1008. The protective coating can be a material that does not easily oxidize such as a layer of nickel under a layer of gold, for example.

The connection post 1008 can have a post top 1018 and a post side 1020. The post top 1018 is defined as the surface of the connection post 1008 opposite the substrate 1002. For example, the post top 1018 can be a flat surface. The post side 1020 is defined as the non-horizontal surface of the connection post 1008. For example, the post side 1020 can extend from the top of the substrate 1002 to the post top 1018. The protective coating can be on the post top 1018 of the connection post 1008.

A solder cap 1032 can be formed on the post top 1018. The solder cap 1032 is defined as conductive material on the connection post 1008. For example, the solder cap 1032 can be only on the post top 1018, and not in contact with the package body 1010. The solder cap 1032 can be formed in various ways. For example, the solder cap 1032 can begin with the application of a solder ball, solder bump, or as a solder paste through a patterning mask on the post top 1018. The solder cap 1032 can be formed by reflow of the solder on the post top 1018.

The shape of the solder cap 1032 can be related to the volume of the solder applied to the post top 1018. For example, the solder cap 1032 can be roughly in the shape of a hemisphere with the flat side on the post top 1018. The solder cap 1032 can be bonded to the protective coating on the post top 1018. The solder cap 1032 can be used to connect to a next level system (not shown).

There can be multiple instances of the connection post 1008 on the substrate 1002. The plurality of the connection post 1008 can be in an array and regularly spaced from each other. The connection post 1008 can be adjacent to and around the integrated circuit die 1006. The post top 1018 of the connection post 1008 can be the same height as the top die surface 1014 of the integrated circuit die 1006. The post top 1018 of the instances of the connection post 1008 can be coplanar with each other and with the top die surface 1014. The instances of the connection post 1008 can be separated by the package body 1010.

The package body 1010 is defined as a cover that provides a hermetic seal protecting components from the outside environment. For example, the package body 1010 can be a film assisted molding, epoxy molding, moldable underfill, encapsulation, or other protective molding, and can protect sensitive components from moisture, dust and other contamination. The package body 1010 can be molded on the substrate 1002, the integrated circuit die 1006, and the connection post 1008.

The package body 1010 can include a top package surface 1030. The integrated circuit die 1006 can be exposed from the top package surface 1030. The top package surface 1030 can be coplanar with the top die surface 1014. Of the connection post 1008, only the post top 1018 can be exposed from the package body 1010. The sides of the package body 1010 can be planar and coplanar with the sides of the substrate 1002.

In this example, the package body 1010 can be molded with a planar mold chase (not shown). The planar mold chase can help form the package body 1010 to have the top package surface 1030 as a planar surface. The top package surface 1030 can be coplanar with the top die surface 1014 and the post top 1018.

It has been discovered that having a protective coating on the post top 1018 of the connection post 1008 and a well-controlled volume of solder can allow for a finer pitch between the instances of the post top 1018. For example, because a small volume of solder in the solder cap 1032 will contact only the protective coating on the post top 1018, the chance of a short from solder bridging is minimized.

It has also been discovered that the top die surface 1014 being exposed from the package body 1010 can enable the manufacture of packages with thinner profiles. For example, because the package body 1010 does not extend above the top die surface 1014, the vertical height of the integrated circuit packaging system 1000 can be minimized.

It has been discovered that by attaching the connection post 1008 prior to molding the package body 1010 on the substrate 1002, cost of manufacture can be decreased. For example, because the connection post 1008 is attached before molding the package body 1010, a process to remove some of the package body 1010 such as laser ablation can be avoided, and the manufacturing process simplified.

It has also been discovered that by using moldable underfill for the package body 1010, cost and complexity of manufacture can be decreased. For example, because moldable underfill is liquid enough to flow under the integrated circuit die 1006 unlike some other kinds of encapsulation, an underfill step can be combined with an encapsulation step, saving time, removing complexity, and saving material cost.

It has also been discovered that by using a relatively large amount of solder in the solder cap 1032, better yield in manufacture can be achieved. For example, because a large instance of the solder cap 1032 can present a larger connection target, alignment of a next level system (not shown) can be more easily achieved, and a stronger, more robust connection can be formed.

It has also been discovered that by forming the solder cap 1032 on the post top 1018 of the connection post 1008 with the rest of the connection post 1008 covered by the package body 1010 can increase reliability of the integrated circuit packaging system 1000. For example, because none of the connection post 1008 is exposed to the air, oxidation or corrosion can be avoided. In addition, there is no need to plate the post top 1018 with an expensive metal that does not oxidize such as gold, which can save on material cost in manufacture.

Figure 11:
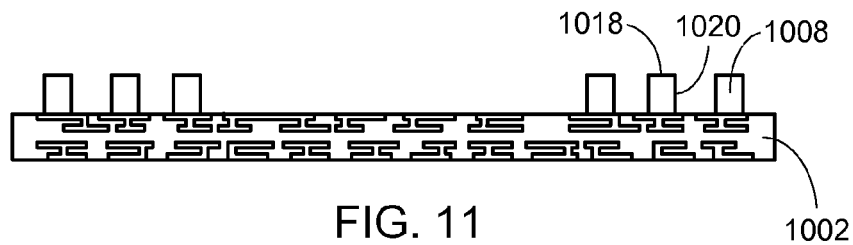
FIG. 11 is a cross-sectional view of the substrate as exemplified by the bottom view of FIG. 3 and along the section line 4-4 of FIG. 3 in a manufacturing step of the integrated circuit packaging system of FIG. 10.

Referring now to FIG. 11, therein is shown a cross-sectional view of the substrate as exemplified by the bottom view of FIG. 3 and along the section line 4-4 of FIG. 3 in a manufacturing step of the integrated circuit packaging system 1000 of FIG. 10. The substrate 1002 is shown with the connection post 1008 attached to the substrate 1002. The connection post 1008 is shown in this manufacturing step with the post top 1018 and the post side 1020 exposed.

Figure 12:
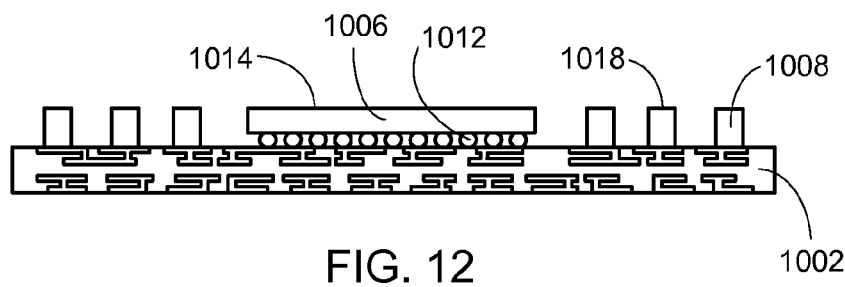
FIG. 12 is the structure of FIG. 11 in mounting the integrated circuit die on the substrate.

Referring now to FIG. 12, therein is shown the structure of FIG. 11 in mounting the integrated circuit die 1006 on the substrate 1002. The integrated circuit die 1006 is shown attached to the substrate 1002 with the internal interconnect 1012. The integrated circuit die 1006 can be mounted between instances of the connection post 1008 in the center of the substrate 1002. The top die surface 1014 can be coplanar with the post top 1018.

Figure 13:
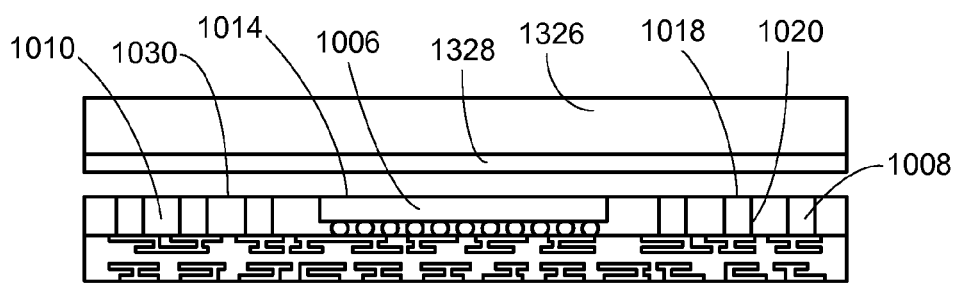
FIG. 13 is the structure of FIG. 12 in forming the package body.

Referring now to FIG. 13, therein is shown the structure of FIG. 12 in forming the package body 1010. The package body 1010 is shown molded on the integrated circuit die 1006 and the connection post 1008, the shape of the package body 1010 formed by a mold chase 1326 and an assist film 1328. The mold chase 1326 and the assist film 1328 are shown after the package body 1010 has been molded but before full removal of the mold chase 1326 and the assist film 1328.

The assist film 1328 is defined as a thin renewable film that conforms to underlying structures. For example, the assist film 1328 can be a deformable seal film, an adhesive film, or other protective film on the mold chase 1326. In this example, the mold chase 1326 has a planar shape in order to allow for forming the package body 1010 with planar top surface. The package body 1010 can include the top package surface 1030 which is defined as the planar top surface of the package body 1010.

The mold chase 1326 and the assist film 1328 can be used in different ways to control the shape of the package body 1010. For example, the mold chase 1326 and the assist film 1328 can be positioned directly on the top die surface 1014 and the post top 1018 prior to molding the package body 1010. The package body 1010 can cover all other surfaces of the integrated circuit die 1006 and the connection post 1008 such as the post side 1020. After removal of the mold chase 1326 and the assist film 1328, the top die surface 1014 and the post top 1018 can be exposed from the package body 1010.

The top package surface 1030 can be characterized by the physical characteristics of the assist film 1328. For example, the assist film 1328 can cause the top package surface 1030 to be smoother than with the use of the mold chase 1326 alone due to the assist film 1328 flattening out during the process of forming the package body 1010. The assist film 1328 being used can leave the post top 1018 and the top die surface 1014 with an unblemished surface due to the softness of the assist film 1328. The assist film 1328 can also leave the post top 1018 and the top die surface 1014 free of mold flash because the assist film 1328 forms a seal against unnecessary bleeding of molding compound.

The mold chase 1326 and the assist film 1328 can define a planar surface so that the top package surface 1030 of the package body 1010, the top die surface 1014, and the post top 1018 can all be coplanar.

It has been discovered that the use of the assist film 1328 during the formation of the package body 1010 can help prevent damage to the integrated circuit die 1006. For example, because the assist film 1328 can absorb some of the pressure from the mold chase 1326 as it is pressed down on the integrated circuit die 1006, the incidence of cracks in the inter-layer dielectric of the integrated circuit die 1006 can be decreased, and reliability of the integrated circuit die 1006 can be increased.

Figure 14:
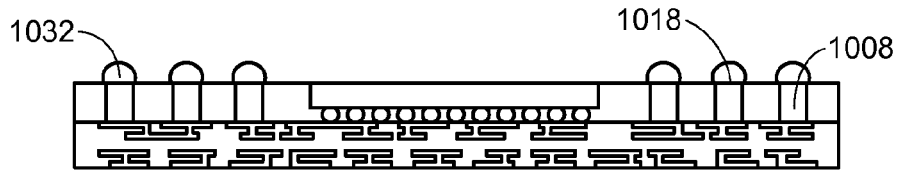
FIG. 14 is the structure of FIG. 13 in forming the solder cap.

Referring now to FIG. 14, therein is shown the structure of FIG. 13 in forming the solder cap 1032. The solder cap 1032 is shown on the post top 1018 of the connection post 1008. The solder cap 1032 can be formed in various ways. For example, the solder cap 1032 can begin with the application of a solder ball, solder bump, or as a solder paste through a patterning mask on the post top 1018. The solder cap 1032 can be formed by reflow of the solder on the post top 1018.

The process of forming the solder cap 1032 on the post top 1018 is also called a solder-on-pad process. The post top 1018, once plated with a material attractive to solder, can function as the pad in the aforementioned process.

Figure 15:
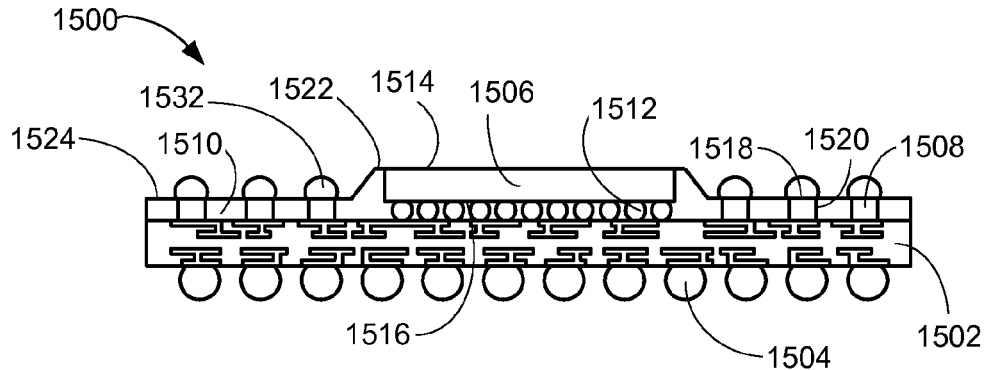
FIG. 15 a cross-sectional view of the integrated circuit packaging system as exemplified by the bottom view of FIG. 1 and along the section line 2-2 of FIG. 1 in a sixth embodiment of the present invention.

Referring now to FIG. 15, therein is shown a cross-sectional view of the integrated circuit packaging system 1500 as exemplified by the bottom view of FIG. 1 and along the section line 2-2 of FIG. 1 in a sixth embodiment of the present invention. The integrated circuit packaging system 1500 is shown having a substrate 1502, an external interconnect 1504, an integrated circuit die 1506, a connection post 1508, and a package body 1510, as an example.

The substrate 1502 is defined as a structure containing conductive traces and contacts. For example, the substrate 1502 can be a laminate substrate, a ceramic substrate, or some other laminated structure for redistribution of signals. The external interconnect 1504 can be attached to the system side of the substrate 1502.

The external interconnect 1504 is defined as an interface connector. For example, the external interconnect 1504 can be a solder ball, a solder bump, a stud bump, a conductive pillar, or other conductive structure.

The integrated circuit die 1506 can be mounted on the substrate 1502 and connected to the substrate 1502 through an internal interconnect 1512. For example, the integrated circuit die 1506 can be a flip chip, a wire-bond chip, or other type of chip. The integrated circuit die 1506 can include a top die surface 1514. The top die surface 1514 is defined as the non-active surface of the integrated circuit die 1506. The integrated circuit die 1506 can have an active side 1516 opposite the top die surface 1514. The active side 1516 is defined as the side of the integrated circuit die 1506 having active circuitry fabricated thereon.

The internal interconnect 1512 is defined as an electrical connector. For example, the internal interconnect 1512 can be a solder ball, a solder bump, or a conductive column.

The internal interconnect 1512 can be on and between the integrated circuit die 1506 and the substrate 1502. In this example, the internal interconnect 1512 can also support the integrated circuit die 1506 over the substrate 1502.

The connection post 1508 can be attached to the substrate 1502 around the integrated circuit die 1506. The connection post 1508 is defined as a solid connection structure that also performs a support function. For example, the connection post 1508 can be a post, a pillar, a cylinder, or other preformed conductive support structure. Also for example, the connection post 1508 can be covered in a protective coating (not shown) to prevent oxidation or corrosion of the connection post 1508. The protective coating can be a material that does not easily oxidize such as a layer of nickel under a layer of gold, for example.

The connection post 1508 can have a post top 1518 and a post side 1520. The post top 1518 is defined as the surface of the connection post 1508 opposite the substrate 1502. For example, the post top 1518 can be a flat surface. The post side 1520 is defined as the non-horizontal surface of the connection post 1508. For example, the post side 1520 can extend from the top of the substrate 1502 to the post top 1518. The protective coating can be on the post top 1518 of the connection post 1508.

A solder cap 1532 can be formed on the post top 1518. The solder cap 1532 is defined as conductive material on the connection post 1508. For example, the solder cap 1532 can be only on the post top 1518, and not in contact with the package body 1510. The solder cap 1532 can be formed in various ways. For example, the solder cap 1532 can begin with the application of a solder ball, solder bump, or as a solder paste through a patterning mask on the post top 1518. The solder cap 1532 can be formed by reflow of the solder on the post top 1518.

The shape of the solder cap 1532 can be related to the volume of the solder applied to the post top 1518. For example, the solder cap 1532 can be roughly in the shape of a hemisphere with the flat side on the post top 1518. The solder cap 1532 can be bonded to the protective coating on the post top 1518. The solder cap 1532 can be used to connect to a next level system (not shown).

There can be multiple instances of the connection post 1508 on the substrate 1502. The plurality of the connection post 1508 can be in an array and regularly spaced from each other. The connection post 1508 can be adjacent to and around the integrated circuit die 1506. The post top 1518 of the connection post 1508 can be at a lower height as the top die surface 1514 of the integrated circuit die 1506. The post top 1518 of the instances of the connection post 1508 can be coplanar with each other. The instances of the connection post 1508 can be separated by the package body 1510.

The package body 1510 is defined as a cover that provides a hermetic seal protecting components from the outside environment. For example, the package body 1510 can be a film assisted molding, epoxy molding, moldable underfill, encapsulation, or other protective molding, and can protect sensitive components from moisture, dust and other contamination. The package body 1510 can be molded on the substrate 1502, the integrated circuit die 1506, and the connection post 1508.

The package body 1510 can include an upper top package surface 1522 and a lower top package surface 1524. The integrated circuit die 1506 can be exposed from the upper top package surface 1522. The upper top package surface 1522 can be coplanar with the top die surface 1514. The lower top package surface 1524 can be coplanar with the post top 1518. The sides of the package body 1510 can be planar and coplanar with the sides of the substrate 1502.

In this example, the package body 1510 can be molded with a stepped mold (not shown). The step mold can cause the package body 1510 to have a two level shape, with a higher level centered around the integrated circuit die 1506, and a lower level around the instances of the connection post 1508. The transition between the two levels can be at an angle so that the package body 1510 around the integrated circuit die 1506 is wider at the bottom than the top. The two level shape can create the upper top package surface 1522 and the lower top package surface 1524.

It has been discovered that having a protective coating on the post top 1518 of the connection post 1508 and a well-controlled volume of solder can allow for a finer pitch between the instances of the post top 1518. For example, because a small volume of solder in the solder cap 1532 will contact only the protective coating on the post top 1518, the chance of a short from solder bridging is minimized.

It has also been discovered that the top die surface 1514 being exposed from the package body 1510 can enable the manufacture of packages with thinner profiles. For example, because the package body 1510 does not extend above the top die surface 1514, the vertical height of the integrated circuit packaging system 1500 can be minimized.

It has been discovered that by attaching the connection post 1508 prior to molding the package body 1510 on the substrate 1502, cost of manufacture can be decreased. For example, because the connection post 1508 is attached before molding the package body 1510, a process to remove some of the package body 1510 such as laser ablation can be avoided, and the manufacturing process simplified.

It has also been discovered that by using moldable underfill for the package body 1510, cost and complexity of manufacture can be decreased. For example, because moldable underfill is liquid enough to flow under the integrated circuit die 1506 unlike some other kinds of encapsulation, an underfill step can be combined with an encapsulation step, saving time, removing complexity, and saving material cost.

It has also been discovered that by using a relatively large amount of solder in the solder cap 1532, better yield in manufacture can be achieved. For example, because a large instance of the solder cap 1532 can present a larger connection target, alignment of a next level system (not shown) can be more easily achieved, and a stronger, more robust connection can be formed.

It has also been discovered that by forming the solder cap 1532 on the post top 1518 of the connection post 1508 with the rest of the connection post 1508 covered by the package body 1510 can increase reliability of the integrated circuit packaging system 1500. For example, because none of the connection post 1508 is exposed to the air, oxidation or corrosion can be avoided. In addition, there is no need to plate the post top 1518 with an expensive metal that does not oxidize such as gold, which can save on material cost in manufacture.

Figure 16:
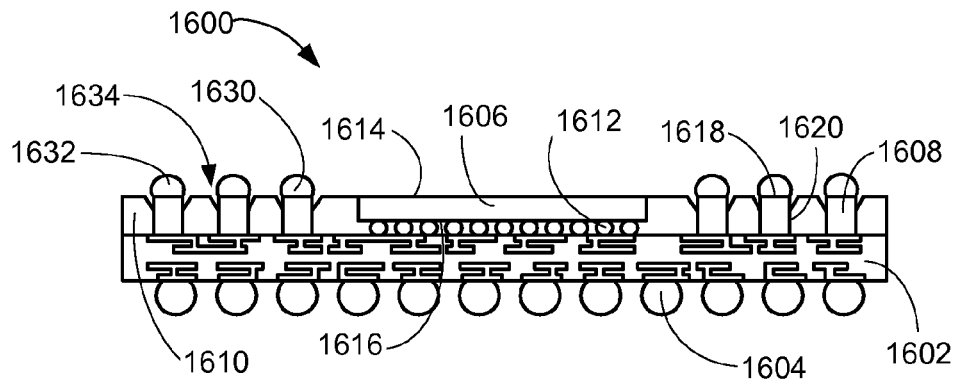
FIG. 16 is a cross-sectional view of the integrated circuit packaging system as exemplified by the bottom view of FIG. 1 and along the section line 2-2 of FIG. 1 in a seventh embodiment of the present invention.

Referring now to FIG. 16, therein is shown a cross-sectional view of the integrated circuit packaging system 1600 as exemplified by the bottom view of FIG. 1 and along the section line 2-2 of FIG. 1 in a seventh embodiment of the present invention. The integrated circuit packaging system 1600 is shown having a substrate 1602, an external interconnect 1604, an integrated circuit die 1606, a connection post 1608, and a package body 1610, as an example.

The substrate 1602 is defined as a structure containing conductive traces and contacts. For example, the substrate 1602 can be a laminate substrate, a ceramic substrate, or some other laminated structure for redistribution of signals. The external interconnect 1604 can be attached to the system side of the substrate 1602.

The external interconnect 1604 is defined as an interface connector. For example, the external interconnect 1604 can be a solder ball, a solder bump, a stud bump, a conductive pillar, or other conductive structure.

The integrated circuit die 1606 can be mounted on the substrate 1602 and connected to the substrate 1602 through an internal interconnect 1612. For example, the integrated circuit die 1606 can be a flip chip, a wire-bond chip, or other type of chip. The integrated circuit die 1606 can include a top die surface 1614. The top die surface 1614 is defined as the non-active surface of the integrated circuit die 1606. The integrated circuit die 1606 can have an active side 1616 opposite the top die surface 1614. The active side 1616 is defined as the side of the integrated circuit die 1606 having active circuitry fabricated thereon.

The internal interconnect 1612 is defined as an electrical connector. For example, the internal interconnect 1612 can be a solder ball, a solder bump, or a conductive column.

The internal interconnect 1612 can be on and between the integrated circuit die 1606 and the substrate 1602. In this example, the internal interconnect 1612 can also support the integrated circuit die 1606 over the substrate 1602.

The connection post 1608 can be attached to the substrate 1602 around the integrated circuit die 1606. The connection post 1608 is defined as a solid connection structure that also performs a support function. For example, the connection post 1608 can be a post, a pillar, a cylinder, or other preformed conductive support structure. Also for example, the connection post 1608 can be covered in a protective coating (not shown) to prevent oxidation or corrosion of the connection post 1608. The protective coating can be a material that does not easily oxidize such as a layer of nickel under a layer of gold, for example.

The connection post 1608 can have a post top 1618 and a post side 1620. The post top 1618 is defined as the surface of the connection post 1608 opposite the substrate 1602. For example, the post top 1618 can be a flat surface. The post side 1620 is defined as the non-horizontal surface of the connection post 1608. For example, the post side 1620 can extend from the top of the substrate 1602 to the post top 1618. The protective coating can be on the post top 1618 of the connection post 1608.

A solder cap 1632 can be formed on the post top 1618. The solder cap 1632 is defined as conductive material on the connection post 1608. For example, the solder cap 1632 can be only on the post top 1618, and not in contact with the package body 1610. The solder cap 1632 can be formed in various ways. For example, the solder cap 1632 can begin with the application of a solder ball, solder bump, or as a solder paste through a patterning mask on the post top 1618. The solder cap 1632 can be formed by reflow of the solder on the post top 1618.

The shape of the solder cap 1632 can be related to the volume of the solder applied to the post top 1618. For example, the solder cap 1632 can be roughly in the shape of a hemisphere with the flat side on the post top 1618. The solder cap 1632 can be bonded to the protective coating on the post top 1618. The solder cap 1632 can be used to connect to a next level system (not shown).

There can be multiple instances of the connection post 1608 on the substrate 1602. The plurality of the connection post 1608 can be in an array and regularly spaced from each other. The connection post 1608 can be adjacent to and around the integrated circuit die 1606. The post top 1618 of the connection post 1608 can be the same height as the top die surface 1614 of the integrated circuit die 1606. The post top 1618 of the instances of the connection post 1608 can be coplanar with each other and with the top die surface 1614. The instances of the connection post 1608 can be separated by the package body 1610.

The package body 1610 is defined as a cover that provides a hermetic seal protecting components from the outside environment. For example, the package body 1610 can be a film assisted molding, epoxy molding, moldable underfill, encapsulation, or other protective molding, and can protect sensitive components from moisture, dust and other contamination. The package body 1610 can be molded on the substrate 1602, the integrated circuit die 1606, and the connection post 1608.

The package body 1610 can include a top package surface 1630. The integrated circuit die 1606 can be exposed from the top package surface 1630. The top package surface 1630 can be coplanar with the top die surface 1614. Of the connection post 1608, only the post top 1618 can be exposed from the package body 1610. The sides of the package body 1610 can be planar and coplanar with the sides of the substrate 1602.

In this example, the package body 1610 can be molded with a planar mold chase (not shown). The planar mold chase can help form the package body 1610 to have the top package surface 1630 as a planar surface. The top package surface 1630 can be coplanar with the top die surface 1614 and the post top 1618. The package body 1610 can have a connector recess 1634.

The connector recess 1634 is defined as a depression in the package body 1610 around the connection post 1608. The connector recess 1634 can have many characteristics. For example, the connector recess 1634 can be wider at the top than the bottom, and as a result can have slanted sides at an obtuse angle relative to the top surface of the substrate 1602. The connector recess 1634 can leave the post side 1620 partially exposed. The connector recess 1634 can be shaped as a funnel centered around the connection post 1608. The top package surface 1630 can be removed so at all points the top package surface 1630 is equidistant from the post top 1618.

The top package surface 1630 can be between the instances of the connector recess 1634. The connector recess 1634 can have varying depths. For example, the connector recess 1634 can expose half or a quarter of the post side 1620.

The connector recess 1634 can be formed in various ways. For example, the connector recess 1634 can be formed by removing portions of the package body 1610 from around the connection post 1608. This removal process can be by laser ablation, etching, sawing, or drilling, for example. The connector recess 1634 can be formed after the package body 1610 is molded on the connection post 1608 and the integrated circuit die 1606.

It has been discovered that having a protective coating on the post top 1618 of the connection post 1608 and a well-controlled volume of solder can allow for a finer pitch between the instances of the post top 1618. For example, because a small volume of solder in the solder cap 1632 will contact only the protective coating on the post top 1618, the chance of a short from solder bridging is minimized.

It has also been discovered that the top die surface 1614 being exposed from the package body 1610 can enable the manufacture of packages with thinner profiles. For example, because the package body 1610 does not extend above the top die surface 1614, the vertical height of the integrated circuit packaging system 1600 can be minimized.

It has also been discovered that by using moldable underfill for the package body 1610, cost and complexity of manufacture can be decreased. For example, because moldable underfill is liquid enough to flow under the integrated circuit die 1606 unlike some other kinds of encapsulation, an underfill step can be combined with an encapsulation step, saving time, removing complexity, and saving material cost.

It has also been discovered that by using a relatively large amount of solder in the solder cap 1632, better yield in manufacture can be achieved. For example, because a large instance of the solder cap 1632 can present a larger connection target, alignment of a next level system (not shown) can be more easily achieved, and a stronger, more robust connection can be formed.

Figure 17:
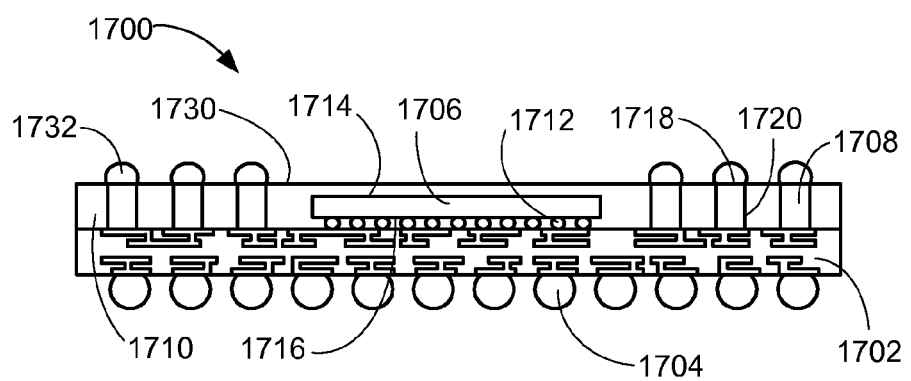
FIG. 17 is a cross-sectional view of the integrated circuit packaging system as exemplified by the bottom view of FIG. 1 and along the section line 2-2 of FIG. 1 in an eighth embodiment of the present invention.

Referring now to FIG. 17, therein is shown a cross-sectional view of the integrated circuit packaging system 1700 as exemplified by the bottom view of FIG. 1 and along the section line 2-2 of FIG. 1 in an eighth embodiment of the present invention. The integrated circuit packaging system 1700 is shown having a substrate 1702, an external interconnect 1704, an integrated circuit die 1706, a connection post 1708, and a package body 1710, as an example.

The substrate 1702 is defined as a structure containing conductive traces and contacts. For example, the substrate 1702 can be a laminate substrate, a ceramic substrate, or some other laminated structure for redistribution of signals. The external interconnect 1704 can be attached to the system side of the substrate 1702.

The external interconnect 1704 is defined as an interface connector. For example, the external interconnect 1704 can be a solder ball, a solder bump, a stud bump, a conductive pillar, or other conductive structure.

The integrated circuit die 1706 can be mounted on the substrate 1702 and connected to the substrate 1702 through an internal interconnect 1712. For example, the integrated circuit die 1706 can be a flip chip, a wire-bond chip, or other type of chip. The integrated circuit die 1706 can include a top die surface 1714. The top die surface 1714 is defined as the non-active surface of the integrated circuit die 1706. The integrated circuit die 1706 can have an active side 1716 opposite the top die surface 1714. The active side 1716 is defined as the side of the integrated circuit die 1706 having active circuitry fabricated thereon.

The internal interconnect 1712 is defined as an electrical connector. For example, the internal interconnect 1712 can be a solder ball, a solder bump, or a conductive column.

The internal interconnect 1712 can be on and between the integrated circuit die 1706 and the substrate 1702. In this example, the internal interconnect 1712 can also support the integrated circuit die 1706 over the substrate 1702.

The connection post 1708 can be attached to the substrate 1702 around the integrated circuit die 1706. The connection post 1708 is defined as a solid connection structure that also performs a support function. For example, the connection post 1708 can be a post, a pillar, a cylinder, or other preformed conductive support structure. Also for example, the connection post 1708 can be covered in a protective coating (not shown) to prevent oxidation or corrosion of the connection post 1708. The protective coating can be a material that does not easily oxidize such as a layer of nickel under a layer of gold, for example.

The connection post 1708 can have a post top 1718 and a post side 1720. The post top 1718 is defined as the surface of the connection post 1708 opposite the substrate 1702. For example, the post top 1718 can be a flat surface. The post side 1720 is defined as the non-horizontal surface of the connection post 1708. For example, the post side 1720 can extend from the top of the substrate 1702 to the post top 1718. The protective coating can be on the post top 1718 of the connection post 1708.

A solder cap 1732 can be formed on the post top 1718. The solder cap 1732 is defined as conductive material on the connection post 1708. For example, the solder cap 1732 can be only on the post top 1718, and not in contact with the package body 1710. The solder cap 1732 can be formed in various ways. For example, the solder cap 1732 can begin with the application of a solder ball, solder bump, or as a solder paste through a patterning mask on the post top 1718. The solder cap 1732 can be formed by reflow of the solder on the post top 1718.

The shape of the solder cap 1732 can be related to the volume of the solder applied to the post top 1718. For example, the solder cap 1732 can be roughly in the shape of a hemisphere with the flat side on the post top 1718. The solder cap 1732 can be bonded to the protective coating on the post top 1718. The solder cap 1732 can be used to connect to a next level system (not shown).

There can be multiple instances of the connection post 1708 on the substrate 1702. The plurality of the connection post 1708 can be in an array and regularly spaced from each other. The connection post 1708 can be adjacent to and around the integrated circuit die 1706. The post top 1718 of the connection post 1708 can be at a higher height as compared to the top die surface 1714 of the integrated circuit die 1706. The post top 1718 of the instances of the connection post 1708 can be coplanar with each other. The instances of the connection post 1708 can be separated by the package body 1710.

The package body 1710 is defined as a cover that provides a hermetic seal protecting components from the outside environment. For example, the package body 1710 can be a film assisted molding, epoxy molding, moldable underfill, encapsulation, or other protective molding, and can protect sensitive components from moisture, dust and other contamination. The package body 1710 can be molded on the substrate 1702, the integrated circuit die 1706, and the connection post 1708.

The package body 1710 can include a top package surface 1730. The integrated circuit die 1706 can be fully covered by the package body 1710. The top package surface 1730 can be above the top die surface 1714. Of the connection post 1708, only the post top 1718 can be exposed from the package body 1710. The sides of the package body 1710 can be planar and coplanar with the sides of the substrate 1702.

In this example, the package body 1710 can be molded with a planar mold chase (not shown). The planar mold chase can help form the package body 1710 to have the top package surface 1730 as a planar surface. The top package surface 1730 can be coplanar with the post top 1718.

It has been discovered that having a protective coating on the post top 1718 of the connection post 1708 and a well-controlled volume of solder can allow for a finer pitch between the instances of the post top 1718. For example, because a small volume of solder in the solder cap 1732 will contact only the protective coating on the post top 1718, the chance of a short from solder bridging is minimized.

It has also been discovered that the integrated circuit die 1706 being fully covered by the package body 1710 can enable the manufacture of packages more resistant to warpage during manufacture or use. For example, because the package body 1710 is rigid, the package body 1710 can prevent the substrate 1702 from warpage under heating or cooling, thereby preventing damage to the integrated circuit die 1706.

It has been discovered that by attaching the connection post 1708 prior to molding the package body 1710 on the substrate 1702, cost of manufacture can be decreased. For example, because the connection post 1708 is attached before molding the package body 1710, a process to remove some of the package body 1710 such as laser ablation can be avoided, and the manufacturing process simplified.

It has also been discovered that by using moldable underfill for the package body 1710, cost and complexity of manufacture can be decreased. For example, because moldable underfill is liquid enough to flow under the integrated circuit die 1706 unlike some other kinds of encapsulation, an underfill step can be combined with an encapsulation step, saving time, removing complexity, and saving material cost.

It has also been discovered that by using a relatively large amount of solder in the solder cap 1732, better yield in manufacture can be achieved. For example, because a large instance of the solder cap 1732 can present a larger connection target, alignment of a next level system (not shown) can be more easily achieved, and a stronger, more robust connection can be formed.

It has also been discovered that by forming the solder cap 1732 on the post top 1718 of the connection post 1708 with the rest of the connection post 1708 covered by the package body 1710 can increase reliability of the integrated circuit packaging system 1700. For example, because none of the connection post 1708 is exposed to the air, oxidation or corrosion can be avoided. In addition, there is no need to plate the post top 1718 with an expensive metal that does not oxidize such as gold, which can save on material cost in manufacture.

Figure 18:
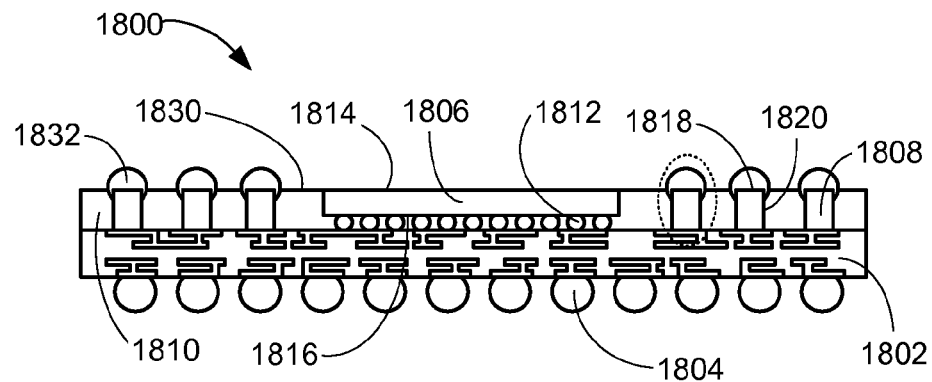
FIG. 18 is a cross-sectional view of the integrated circuit packaging system as exemplified by the bottom view of FIG. 1 and along the section line 2-2 of FIG. 1 in a ninth embodiment of the present invention.

Referring now to FIG. 18, therein is shown a cross-sectional view of the integrated circuit packaging system 1800 as exemplified by the bottom view of FIG. 1 and along the section line 2-2 of FIG. 1 in a ninth embodiment of the present invention. The integrated circuit packaging system 1800 is shown having a substrate 1802, an external interconnect

1804, an integrated circuit die 1806, a connection post 1808, and a package body 1810, as an example.

The substrate 1802 is defined as a structure containing conductive traces and contacts. For example, the substrate 1802 can be a laminate substrate, a ceramic substrate, or some other laminated structure for redistribution of signals. The external interconnect 1804 can be attached to the system side of the substrate 1802.

The external interconnect 1804 is defined as an interface connector. For example, the external interconnect 1804 can be a solder ball, a solder bump, a stud bump, a conductive pillar, or other conductive structure.

The integrated circuit die 1806 can be mounted on the substrate 1802 and connected to the substrate 1802 through an internal interconnect 1812. For example, the integrated circuit die 1806 can be a flip chip, a wire-bond chip, or other type of chip. The integrated circuit die 1806 can include a top die surface 1814. The top die surface 1814 is defined as the non-active surface of the integrated circuit die 1806. The integrated circuit die 1806 can have an active side 1816 opposite the top die surface 1814. The active side 1816 is defined as the side of the integrated circuit die 1806 having active circuitry fabricated thereon.

The internal interconnect 1812 is defined as an electrical connector. For example, the internal interconnect 1812 can be a solder ball, a solder bump, or a conductive column.

The internal interconnect 1812 can be on and between the integrated circuit die 1806 and the substrate 1802. In this example, the internal interconnect 1812 can also support the integrated circuit die 1806 over the substrate 1802.

The connection post 1808 can be attached to the substrate 1802 or formed on the substrate 1802 around the integrated circuit die 1806. In this example, attachment of the connection post 1808 to the substrate 1802 can include forming the connection post 1808 directly on the substrate 1802. The connection post 1808 is defined as a solid connection structure that also performs a support function. For example, the connection post 1808 can be a post, a pillar, a cylinder, or other conductive support structure. Also for example, the connection post 1808 can be covered in a protective coating (not shown) to prevent oxidation or corrosion of the connection post 1808. The protective coating can be a material that does not easily oxidize such as a layer of nickel under a layer of gold, for example.

The connection post 1808 can have a post top 1818 and a post side 1820. The post top 1818 is defined as the surface of the connection post 1808 opposite the substrate 1802. For example, the post top 1818 can be a flat surface. The post side 1820 is defined as the non-horizontal surface of the connection post 1808. For example, the post side 1820 can extend from the top of the substrate 1802 to the post top 1818. The protective coating can be on the post top 1818 of the connection post 1808.

A solder cap 1832 can be formed on the post top 1818 and the post side 1820. The solder cap 1832 is defined as conductive material on the connection post 1808. For example, the solder cap 1832, such as a post cover, can be on the post top 1818 and a portion of the post side 1820 while also being in contact with the package body 1810. The portion of the solder cap 1832 covering the post side 1820 can be embedded in the package body 1810, with the rest of the solder cap 1832 exposed above the package body 1810.

The solder cap 1832 can be formed in various ways. For example, the solder cap 1832 can begin with the application of a solder ball, solder bump, or as a solder paste through a patterning mask on the post top 1818. The solder cap 1832 can be formed by reflow of the solder on the post top 1818. Proper control of the volume of solder first applied can allow for the formation of the solder cap 1832 only partially covering the post side 1820.

The shape of the solder cap 1832 can be related to the volume of the solder applied to the post top 1818. For example, the solder cap 1832 can be roughly in the shape of a sphere due to surface tension. The solder cap 1832 can be shaped as a rounded protrusion which extends from and partially engulfs the connection post 1808. The solder cap 1832 can be bonded to the protective coating on the post top 1818. The solder cap 1832 can be used to connect to a next level system (not shown).

There can be multiple instances of the connection post 1808 on the substrate 1802. The plurality of the connection post 1808 can be in an array and regularly spaced from each other. The connection post 1808 can be adjacent to and around the integrated circuit die 1806. The post top 1818 of the connection post 1808 can be the same height as the top die surface 1814 of the integrated circuit die 1806. The post top 1818 of the instances of the connection post 1808 can be coplanar with each other and with the top die surface 1814. The instances of the connection post 1808 can be separated by the package body 1810.

The package body 1810 is defined as a cover that provides a hermetic seal protecting components from the outside environment. For example, the package body 1810 can be a film assisted molding, epoxy molding, moldable underfill, encapsulation, or other protective molding, and can protect sensitive components from moisture, dust and other contamination. The package body 1810 can be molded on the substrate 1802, the integrated circuit die 1806, the connection post 1808, and a portion of the solder cap 1832.

The package body 1810 can include a top package surface 1830. The integrated circuit die 1806 can be exposed from the top package surface 1830. The top package surface 1830 can be coplanar with the top die surface 1814. The connection post 1808 will be fully covered by either the package body 1810 or the solder cap 1832. The sides of the package body 1810 can be planar and coplanar with the sides of the substrate 1802. The top of the solder cap 1832 can extend out past the top package surface 1830.

In this example, the package body 1810 can be molded with a planar mold chase (not shown). The planar mold chase can help form the package body 1810 to have the top package surface 1830 as a planar surface. The top package surface 1830 can be coplanar with the top die surface 1814 and the post top 1818. A film on the planar mold chase can be used in order to account for the solder cap 1832 being at a different height than the top die surface 1814.

It has been discovered that having the solder cap 1832 on the connection post 1808 partially embedded in the package body 1810 can allow for a finer pitch between the instances of the post top 1818 and the solder cap 1832. For example, because the solder in the solder cap 1832 is partially embedded in the package body 1810, the solder cap 1832 will tend to stay within the recess in the package body 1810 even during reflow processes so that the chance of a short from solder bridging is minimized.

It has also been discovered that the top die surface 1814 being exposed from the package body 1810 can enable the manufacture of packages with thinner profiles. For example, because the package body 1810 does not extend above the top die surface 1814, the vertical height of the integrated circuit packaging system 1800 can be minimized.

It has been discovered that by attaching the connection post 1808 prior to molding the package body 1810 on the substrate 1802, cost of manufacture can be decreased. For example, because the connection post 1808 is attached before molding the package body 1810, a process to remove some of the package body 1810 such as laser ablation can be avoided, and the manufacturing process simplified.

It has also been discovered that by using moldable underfill for the package body 1810, cost and complexity of manufacture can be decreased. For example, because moldable underfill is liquid enough to flow under the integrated circuit die 1806 unlike some other kinds of encapsulation, an underfill step can be combined with an encapsulation step, saving time, removing complexity, and saving material cost.

It has also been discovered that by using a relatively large amount of solder in the solder cap 1832, better yield in manufacture can be achieved. For example, because a large instance of the solder cap 1832 can present a larger connection target, alignment of a next level system (not shown) can be more easily achieved, and a stronger, more robust connection can be formed.

It has also been discovered that by forming the solder cap 1832 on the post top 1818 and a portion of the post side 1820 of the connection post 1808 with the rest of the connection post 1808 covered by the package body 1810 can increase reliability of the integrated circuit packaging system 1800. For example, because none of the instances of the connection post 1808 are exposed to the air, oxidation or corrosion can be avoided. In addition, there is no need to plate the post top 1818 with an expensive metal that does not oxidize such as gold, which can save on material cost in manufacture.

Figure 19:
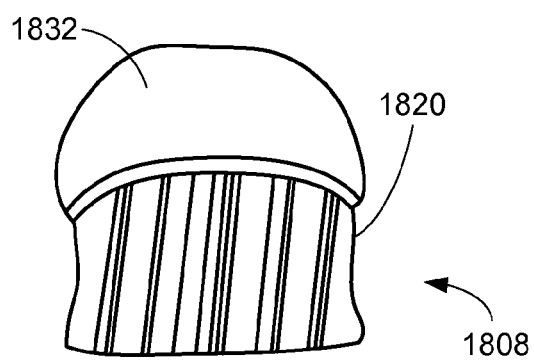
FIG. 19 is an exemplary side view of the connection post with the solder cap from within the inset dotted oval of FIG. 18.

Referring now to FIG. 19, therein is shown an exemplary side view of the connection post 1808 with the solder cap 1832 from within the inset dotted oval of FIG. 18. The connection post 1808 has the same characteristics as described in FIG. 18, but more detail can be seen in FIG. 19. Notably, it can be seen that the solder cap 1832 can unevenly cover the post side 1820.

Figure 20:
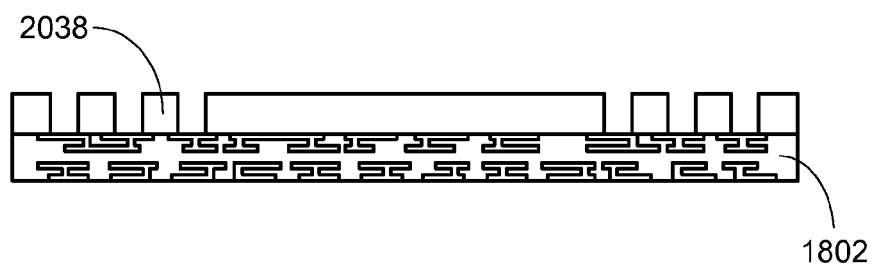
FIG. 20 is a cross-sectional view of the substrate as exemplified by the bottom view of FIG. 3 and along the section line 4-4 of FIG. 3 in a manufacturing step of the integrated circuit packaging system of FIG. 18.

Referring now to FIG. 20, therein is shown a cross-sectional view of the substrate as exemplified by the bottom view of FIG. 3 and along the section line 4-4 of FIG. 3 in a manufacturing step of the integrated circuit packaging system 1800 of FIG. 18. The substrate 1802 is shown with a masking layer 2038 on the substrate 1802. The masking layer 2038 can be a material that is unattractive to solder such as solder resist or a solder mask. The masking layer 2038 is shown in this manufacturing step patterned with holes that exposed portions of the substrate 1802.

Figure 21:
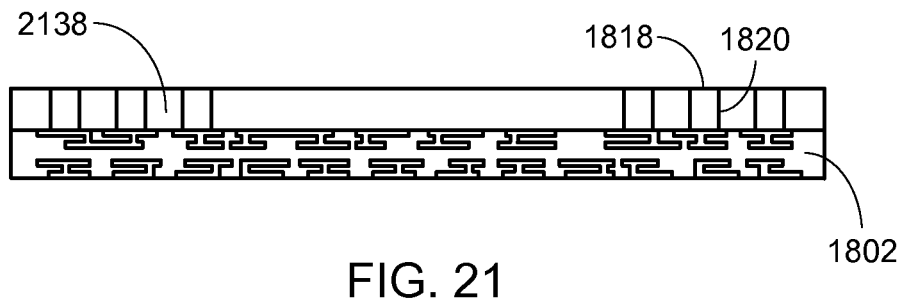
FIG. 21 is the structure of FIG. 20 in forming the connection post in the masking layer.

Referring now to FIG. 21, therein is shown the structure of FIG. 20 in forming the connection post 1808 in the masking layer 2038. The masking layer 2038 is shown as covering the substrate 1802 and the post side 1820 while leaving the post top 1818 exposed. The connection post 1808 can be formed through deposition of metal in a process such as plating, sputtering, or chemical vapor deposition.

Figure 22:
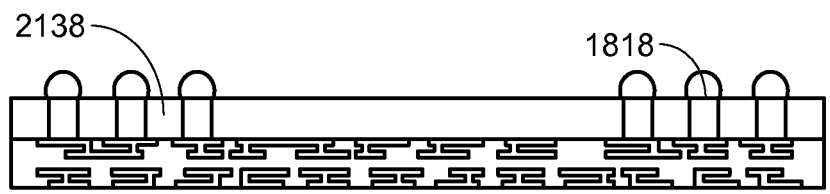
FIG. 22 is the structure of FIG. 21 in depositing solder on the connection post.

Referring now to FIG. 22, therein is shown the structure of FIG. 21 in depositing solder on the connection post 1808. The solder is shown on the post top 1818 of the connection post 1808. The solder can be a precursor to the solder cap 1832 of FIG. 18. For example, the solder can be applied as a solder ball, solder bump, or as a solder paste through a patterning mask on the post top 1818. The masking layer 2038 can be less attractive to solder than the post top 1818, ensuring that the solder is deposited only on the post top 1818. If necessary, a reflow process can be used to allow the solder to flow to the post top 1818.

Figure 23:
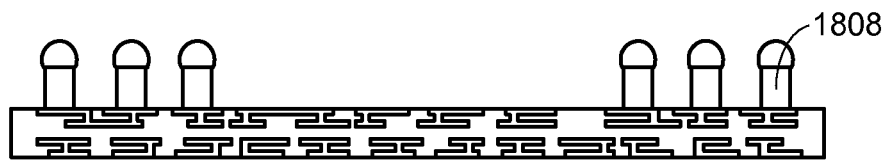
FIG. 23 is the structure of FIG. 22 in removing the masking layer of FIG. 20.

Referring now to FIG. 23, therein is shown the structure of FIG. 22 in removing the masking layer 2038 of FIG. 21. The masking layer 2038 can be removed by a number of processes that leave the connection post 1808 and the precursor to the solder cap 1832 of FIG. 18 intact. For example, the masking layer 2038 can be removed by a process such as a chemical wash or dissolving the masking layer 2038 with a solvent.

Figure 24:
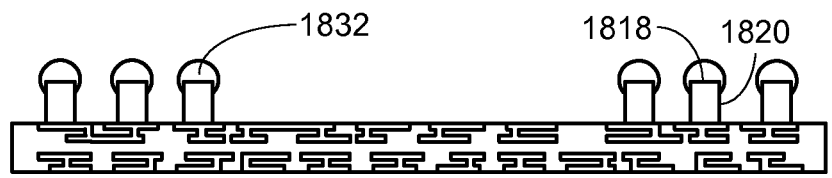
FIG. 24 is the structure of FIG. 23 in forming the solder cap.

Referring now to FIG. 24, therein is shown the structure of FIG. 23 in forming the solder cap 1832. The solder cap 1832 can be formed on the post top 1818 and a portion of the post side 1820 by reflowing the solder that was previously deposited. The full collapse of the solder cap 1832 off the post top 1818 can be prevented through careful control of the volume of solder used.

Figure 25:
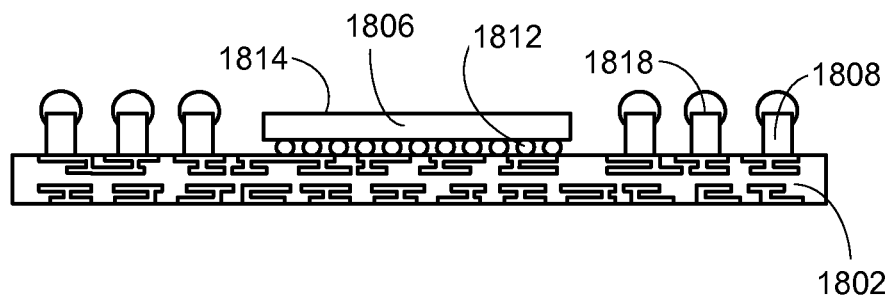
FIG. 25 is the structure of FIG. 24 in mounting the integrated circuit die on the substrate.

Referring now to FIG. 25, therein is shown the structure of FIG. 24 in mounting the integrated circuit die 1806 on the substrate 1802. The integrated circuit die 1806 is shown attached to the substrate 1802 with the internal interconnect 1812. The integrated circuit die 1806 can be mounted between instances of the connection post 1808 in the center of the substrate 1802. The top die surface 1814 can be coplanar with the post top 1818.

Figure 26:
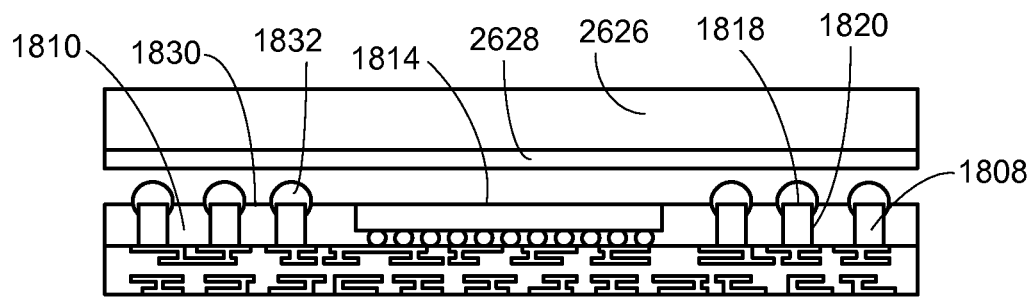
FIG. 26 is the structure of FIG. 25 in forming the package body.

Referring now to FIG. 26, therein is shown the structure of FIG. 25 in forming the package body 1810. The package body 1810 is shown molded on the integrated circuit die 1806 and the connection post 1808, the shape of the package body 1810 formed by a mold chase 2626 and an assist film 2628. The mold chase 2626 and the assist film 2628 are shown after the package body 1810 has been molded but before full removal of the mold chase 2626 and the assist film 2628.

The assist film 2628 is defined as a thin renewable film that conforms to underlying structures. For example, the assist film 2628 can be a deformable seal film, an adhesive film, or other protective film on the mold chase 2626. In this example, the mold chase 2626 has a planar shape in order to allow for forming the package body 1810 with planar top surface. The package body 1810 can include the top package surface 1830 which is defined as the planar top surface of the package body 1810.

The mold chase 2626 and the assist film 2628 can be used in different ways to control the shape of the package body 1810. For example, the mold chase 2626 and the assist film 2628 can be positioned directly on the top die surface 1814 and the post top 1818 prior to molding the package body 1810. The package body 1810 can cover all other surfaces of the integrated circuit die 1806, a portion of the solder cap 1832, and the connection post 1808 such as the post side 1820. After removal of the mold chase 2626 and the assist film 2628, the top die surface 1814 and the post top 1818 can be exposed from the package body 1810.

The top package surface 1830 can be characterized by the physical characteristics of the assist film 2628. For example, the assist film 2628 can cause the top package surface 1830 to be smoother than with the use of the mold chase 2626 alone due to the assist film 2628 flattening out during the process of forming the package body 1810. The assist film 2628 being used can leave the post top 1818 and the top die surface 1814 with an unblemished surface due to the softness of the assist film 2628. The assist film 2628 can also leave the post top 1818 and the top die surface 1814 free of mold flash because the assist film 2628 forms a seal against unnecessary bleeding of molding compound.

The mold chase 2626 and the assist film 2628 can define a planar surface so that the top package surface 1830 of the package body 1810, the top die surface 1814, and the post top 1818 can all be coplanar.

For illustrative purposes, the mold chase 2626 is described as a planar surface, though it is understood that the mold chase 2626 can be patterned to better allow the assist film 2628 to fit over the solder cap 1832 which extends above the top package surface 1830. The patterning in the mold chase 2626 can allow the molding of the package body 1810 without deforming the solder cap 1832.

It has been discovered that the use of the assist film 2628 during the formation of the package body 1810 can help prevent damage to the integrated circuit die 1806. For example, because the assist film 2628 can absorb some of the pressure from the mold chase 2626 as it is pressed down on the integrated circuit die 1806, the incidence of cracks in the inter-layer dielectric of the integrated circuit die 1806 can be decreased, and reliability of the integrated circuit die 1806 can be increased.

Figure 27:
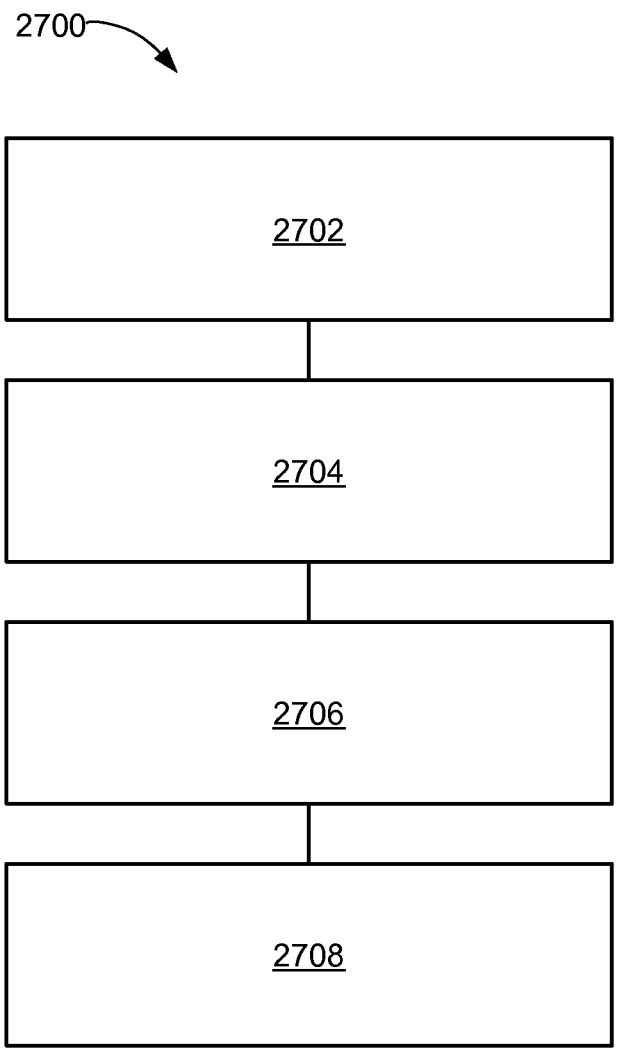
FIG. 27 is a flow chart of a method of manufacture of the integrated circuit packaging system in a further embodiment of the present invention.

Referring now to FIG. 27, therein is shown a flow chart of a method 2700 of manufacture of the integrated circuit packaging system 100 in a further embodiment of the present invention. The method 2700 includes: providing a substrate in a block 2702; attaching a connection post to the substrate, the connection post having a post top and a post side in a block 2704; mounting an integrated circuit die on the substrate, the integrated circuit die having a top die surface in a block 2706; and forming a package body on the substrate, the connection post, and the integrated circuit die in a block 2708.

Thus, it has been discovered that the integrated circuit packaging system 1800 and the solder cap 1832 of the present invention furnish important and heretofore unknown and unavailable solutions, capabilities, and functional aspects for reliable and cost-effective manufacture of modules for stacking or further connection.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a substrate;
   forming a masking layer on the substrate;
   patterning the masking layer to expose portions of the substrate;
   forming a connection post on the substrate and in the masking layer, the connection post having a post top and a post side;
   providing a protective coating on the post top;
   forming a solder cap on the post top;
   removing the masking layer;
   mounting an integrated circuit die on the substrate, the integrated circuit die having a top die surface; and
   forming a package body on the substrate, the connection post, a portion of the solder cap, and the integrated circuit die, wherein forming the package body includes:
   providing a mold chase having an assist film;
   positioning the assist film on the solder cap and the top die surface;
   forming the package body in a single step with a moldable underfill between the assist film and the substrate and directly between the integrated circuit die and the substrate; and
   completely removing the assist film and thereby exposing the solder cap on the post top and the top die surface from the package body.

2. The method as claimed in claim 1 further comprising attaching an external interconnect to the substrate.

3. The method as claimed in claim 1 wherein forming the solder cap on the post top includes forming the solder cap only on the post top.

4. The method as claimed in claim 1 wherein forming the solder cap on the post top includes forming the solder cap on the post top and a portion of the post side.

5. The method as claimed in claim 1 wherein forming the package body includes forming the package body with a portion of the solder cap in contact with the package body.

6. A method of manufacture of an integrated circuit packaging system comprising:
   providing a substrate;
   forming a masking layer on the substrate;
   patterning the masking layer to expose portions of the substrate;
   forming a connection post on the substrate and in the masking layer, the connection post having a post top and a post side;
   removing the masking layer;
   mounting an integrated circuit die on the substrate, the integrated circuit die having a top die surface;
   forming a solder cap on the connection post;
   reflowing the solder cap on the post top and a portion of the post side; and
   forming a package body on the substrate, the connection post, a portion of the solder cap, and the integrated circuit die, wherein forming the package body includes:
   providing a mold chase having an assist film;
   positioning the assist film on the solder cap and the top die surface;
   forming the package body in a single step with a moldable underfill between the assist film and the substrate and directly between the integrated circuit die and the substrate, the package body in contact with a portion of the solder cap; and
   completely removing the assist film thereby exposing the solder cap and the top die surface from the package body.

7. The method as claimed in claim 6 wherein forming the package body on the connection post includes forming a top package surface of the package body coplanar with the post top.

8. The method as claimed in claim 6 wherein forming the package body on the integrated circuit die includes forming a top package surface of the package body coplanar with the top die surface.

9. The method as claimed in claim 6 wherein attaching the connection post to the substrate includes attaching the connection post having the post top lower than the top die surface.

10. The method as claimed in claim 6 further comprising forming a connector recess in the package body by removing the package body around the connection post exposing a portion of the post side.

* * * * *